(12) United States Patent
Park et al.

(10) Patent No.: US 11,894,412 B2
(45) Date of Patent: Feb. 6, 2024

(54) DISPLAY DEVICE INCLUDING A LIGHT-EMITTING ELEMENT BETWEEN A FIRST ELECTRODE AND A SECOND ELECTRODE THEREON

(71) Applicant: Samsung Display Co., Ltd., Yongin-si (KR)

(72) Inventors: Sang Ho Park, Hwaseong-si (KR); Sung Hoon Kim, Seoul (KR); Jin Yeong Kim, Icheon-si (KR); Jin Taek Kim, Yongin-si (KR); Tae Hoon Yang, Yongin-si (KR); Sung Jin Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 477 days.

(21) Appl. No.: 17/097,932

(22) Filed: Nov. 13, 2020

(65) Prior Publication Data

US 2021/0151499 A1    May 20, 2021

(30) Foreign Application Priority Data

Nov. 14, 2019    (KR) ........................ 10-2019-0145768

(51) Int. Cl.
*H01L 27/15*    (2006.01)
*H01L 33/38*    (2010.01)
(Continued)

(52) U.S. Cl.
CPC ........ *H01L 27/156* (2013.01); *H01L 25/0753* (2013.01); *H01L 33/38* (2013.01);
(Continued)

(58) Field of Classification Search
None
See application file for complete search history.

(56) References Cited

U.S. PATENT DOCUMENTS

2011/0089850 A1    4/2011    Akihide et al.
2011/0254043 A1    10/2011   Negishi et al.
(Continued)

FOREIGN PATENT DOCUMENTS

KR    10-2012-0122159 A    11/2012
KR    10-2015-0006798 A    1/2015
(Continued)

*Primary Examiner* — Scott B Geyer
(74) *Attorney, Agent, or Firm* — Lewis Roca Rothgerber Christie LLP

(57) ABSTRACT

A display device includes a substrate having an emission area and a non-emission area, a first electrode and a second electrode spaced from each other on the substrate in the emission area, a first insulating layer on the substrate in the emission area and the non-emission area and covering at least a portion of the first electrode and the second electrode, a light-emitting element between the first electrode and the second electrode, a first contact electrode on the first electrode and in contact with one end portion of the light-emitting element, and a second contact electrode on the second electrode and in contact with the other end portion of the light-emitting element, a first active material layer on the first insulating layer in the non-emission area and electrically connected to the first contact electrode, and a gate insulating layer on the first active material layer.

20 Claims, 27 Drawing Sheets

(51) Int. Cl.
  *H01L 33/40* (2010.01)
  *H01L 33/62* (2010.01)
  *H01L 25/075* (2006.01)
  *H01L 33/36* (2010.01)

(52) U.S. Cl.
  CPC ............ *H01L 33/405* (2013.01); *H01L 33/62* (2013.01); *H01L 33/36* (2013.01)

(56) References Cited

U.S. PATENT DOCUMENTS

| | | | |
|---|---|---|---|
| 2014/0145237 A1 | 5/2014 | Do et al. | |
| 2018/0012876 A1* | 1/2018 | Kim | H01L 33/387 |
| 2018/0019369 A1* | 1/2018 | Cho | H05K 1/11 |
| 2018/0019377 A1* | 1/2018 | Kim | H01L 33/38 |
| 2018/0198018 A1* | 7/2018 | Kim | H01L 33/0095 |
| 2019/0244567 A1 | 8/2019 | Cho et al. | |
| 2019/0245126 A1* | 8/2019 | Lim | H01L 33/36 |
| 2020/0013929 A1* | 1/2020 | Lee | H01L 33/005 |
| 2020/0043976 A1* | 2/2020 | Kim | H01L 25/0753 |
| 2020/0135089 A1* | 4/2020 | Ji | H01L 33/62 |
| 2020/0403030 A1* | 12/2020 | Lee | H01L 33/38 |
| 2021/0057610 A1* | 2/2021 | Yang | H01L 25/0753 |
| 2021/0091050 A1* | 3/2021 | Heo | H01L 33/44 |
| 2021/0159250 A1* | 5/2021 | Chang | H10K 59/90 |
| 2021/0327954 A1* | 10/2021 | Cho | H01L 27/156 |
| 2021/0384252 A1* | 12/2021 | Lee | H01L 29/7869 |
| 2022/0052031 A1* | 2/2022 | Kang | H01L 25/167 |
| 2022/0102604 A1* | 3/2022 | Do | H01L 24/95 |
| 2022/0158052 A1* | 5/2022 | Lee | H01L 25/167 |
| 2022/0181522 A1* | 6/2022 | Moon | H01L 27/124 |
| 2022/0285586 A1* | 9/2022 | Yang | H01L 33/387 |
| 2022/0352244 A1* | 11/2022 | Kang | H01L 25/167 |
| 2022/0375990 A1* | 11/2022 | Im | G09G 3/3233 |
| 2022/0392947 A1* | 12/2022 | Oh | G09G 3/3233 |
| 2022/0406972 A1* | 12/2022 | Im | H01L 27/156 |
| 2023/0006101 A1* | 1/2023 | Kim | H01L 27/156 |

FOREIGN PATENT DOCUMENTS

| | | |
|---|---|---|
| KR | 10-2017-0102147 A | 9/2017 |
| KR | 10-2018-0007025 A | 1/2018 |
| KR | 10-2018-0071465 A | 6/2018 |
| KR | 10-2019-0096475 A | 8/2019 |
| WO | WO-2020075936 A1 * | 4/2020 ......... H01L 25/0753 |

* cited by examiner

DISPLAY DEVICE INCLUDING A LIGHT-EMITTING ELEMENT BETWEEN A FIRST ELECTRODE AND A SECOND ELECTRODE THEREON

CROSS-REFERENCE TO RELATED APPLICATION

This application claims priority to and the benefit of Korean Patent Application No. 10-2019-0145768, filed on Nov. 14, 2019 in the Korean Intellectual Property Office, the disclosure of which is incorporated herein by reference in its entirety.

BACKGROUND

1. Field

The present disclosure relates to a display device.

2. Description of the Related Art

The importance of display devices is increasing with the development of multimedia. Accordingly, various types of display devices such as an organic light-emitting display (OLED) device or a liquid crystal display (LCD) device are being used.

Display devices are devices that display an image and include a display panel such as an organic light-emitting display panel or a liquid crystal display panel. Among these, the display device may include light-emitting elements as a light-emitting display panel. For example, a light-emitting diode (LED) may include an organic LED that uses an organic material as a fluorescent material, an inorganic LED that uses an inorganic material as a fluorescent material, or the like.

SUMMARY

Aspects of the present disclosure provide a display device including a light-emitting element and a transistor in which an active material layer includes an oxide semiconductor.

Aspects of the present disclosure also provide a display device whose fabricating process is simplified by performing a process of forming the above-described transistor above the light-emitting element.

It should be noted that aspects of the present disclosure are not limited to the above-described aspects, and other aspects of the present disclosure will be apparent to those skilled in the art from the following descriptions.

According to some example embodiments of the present disclosure, a display device includes a substrate having an emission area and a non-emission area, a first electrode and a second electrode spaced from each other on the substrate in the emission area, a first insulating layer on the substrate in the emission area and the non-emission area and covering at least a portion of the first electrode and the second electrode, a light-emitting element between the first electrode and the second electrode, a first contact electrode on the first electrode and in contact with one end portion of the light-emitting element, and a second contact electrode on the second electrode and in contact with the other end portion of the light-emitting element, and a first active material layer on the first insulating layer in the non-emission area and electrically connected to the first contact electrode, a gate insulating layer on the first active material layer, a gate electrode on the gate insulating layer and overlapping the first active material layer, and an one electrode in contact with at least one side of the first active material layer, wherein the first contact electrode and the second contact electrode are at the same layer as the first active material layer.

In some example embodiments, the first active material layer, the first contact electrode, and the second contact electrode may include an oxide semiconductor.

In some example embodiments, the first active material layer may include a first conductive area, a second conductive area, and a channel area positioned between the first conductive area and the second conductive area, and the first contact electrode and the second contact electrode may include the same material as the first conductive area.

In some example embodiments, the light-emitting element may not overlap at least the first active material layer in a thickness direction.

In some example embodiments, the display device may further include a second insulating layer on the first contact electrode, the second contact electrode, and the first active material layer in the emission area and the non-emission area.

In some example embodiments, at least a portion of the first contact electrode and the second contact electrode may be on the first insulating layer.

In some example embodiments, the second insulating layer may cover at least a portion of the first active material layer and the gate electrode.

In some example embodiments, the one electrode may be on the second insulating layer and may be in contact with the first contact electrode.

In some example embodiments, the display device may further include a third insulating layer on the light-emitting element and exposing both end portions of the light-emitting element.

In some example embodiments, the first contact electrode and the second contact electrode may be in contact with the third insulating layer.

In some example embodiments, the display device may further include a color filter layer on the second insulating layer and overlapping the light-emitting element.

In some example embodiments, the display device may further include a reflective layer on the second insulating layer and overlapping the second electrode.

In some example embodiments, the display device may further include a light-shielding layer between the first insulating layer, and the substrate and below the first active material layer in the non-emission area.

In some example embodiments, the display device may further include a first bank between the first electrode and the substrate, and a second bank between the second electrode and the substrate.

In some example embodiments, the first electrode, the second electrode, and the light-shielding layer may include a first metal layer on the substrate and a second metal layer on the first metal layer.

In some example embodiments, the first metal layer may have a width greater than a width of the second metal layer, and the second metal layer has a thickness greater than a thickness of the first metal layer.

According to some example embodiments of the present disclosure, a display device includes a substrate having an emission area and a non-emission area, a first electrode on the substrate in the emission area and extending in a first direction, a second electrode spaced from the first electrode in a second direction and extending in the first direction, a plurality of light-emitting elements between the first electrode and the second electrode, a first contact electrode extending in the first direction on the first electrode and in contact with one end portion of each of the light-emitting elements, a second contact electrode extending in the first direction on the second electrode and in contact with the other end portion of each of the light-emitting elements, a first voltage line located in the non-emission area and extending in the first direction, a first semiconductor area located in the non-emission area and extending in the second direction and partially overlapping the first voltage line and an one electrode overlapping the first contact electrode and one side of the first semiconductor area.

In some example embodiments, the display device may further include a light-shielding layer located in the non-emission area and extending in the first direction to partially overlap the first semiconductor area.

In some example embodiments, the first semiconductor area may be in contact with the first voltage line through a first contact hole exposing the first voltage line in an area overlapping the first voltage line, and the one electrode may be in contact with the first contact electrode and one side of the first semiconductor area.

In some example embodiments, a pad electrode may be on the first voltage line exposed through the first contact hole, and the first semiconductor area may be in contact with the pad electrode.

BRIEF DESCRIPTION OF THE DRAWINGS

The above and other aspects and features of the present disclosure will become more apparent by describing example embodiments thereof in detail with reference to the attached drawings, in which.

DETAILED DESCRIPTION

Figure 1:
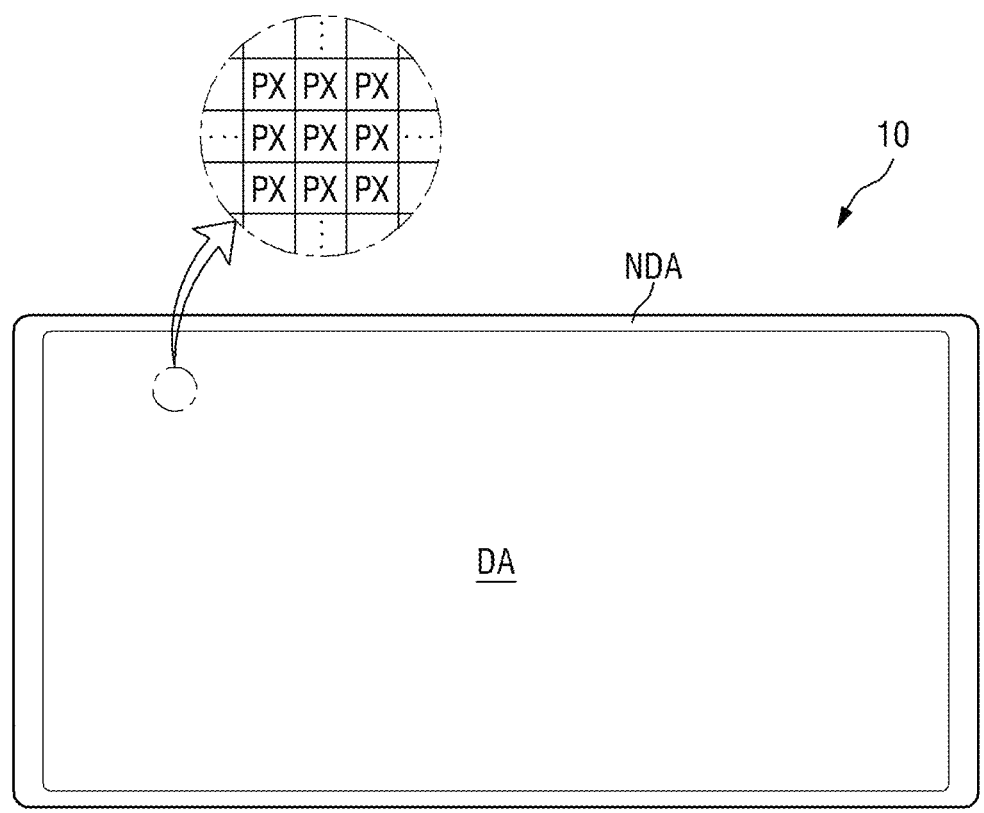
FIG. 1 is a schematic view of a display device, according to some example embodiments of the present disclosure.
Figure 1:
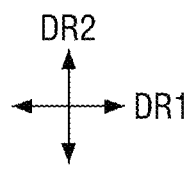

Example embodiments of the present disclosure will now be described more fully hereinafter with reference to the accompanying drawings, in which example embodiments of the present disclosure are shown. Example embodiments of the present disclosure may, however, be embodied in different forms and should not be construed as limited to the embodiments set forth herein. Rather, these example embodiments are provided so that this disclosure will be thorough and complete, and will filly convey the scope of the present disclosure to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the present disclosure. Similarly, the second element could also be termed the first element.

Spatially relative terms, such as "beneath", "below", "lower", "under", "above", "upper" and the like, may be used herein for ease of description to describe one element or feature's relationship to another element(s) or feature(s) as illustrated in the figures. It will be understood that such spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the terms "substantially," "about," and similar terms are used as terms of approximation and not as terms of degree, and are intended to account for the inherent deviations in measured or calculated values that would be recognized by those of ordinary skill in the art.

As used herein, the singular forms "a" and "an" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the inventive concept refers to "one or more embodiments of the present invention". Also, the term "exemplary" is intended to refer to an example or illustration. As used herein, the terms "use," "using," and "used" may be considered synonymous with the terms "utilize," "utilizing," and "utilized," respectively.

It will be understood that when an element or layer is referred to as being "on", "connected to", "coupled to", or "adjacent to" another element or layer, it may be directly on, connected to, coupled to, or adjacent to the other element or layer, or one or more intervening elements or layers may be present. In contrast, when an element or layer is referred to as being "directly on", "directly connected to", "directly coupled to", or "immediately adjacent to" another element or layer, there are no intervening elements or layers present.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein.

Hereinafter, example embodiments will be described with reference to the attached drawings.

FIG. 1 is a schematic plan view of a display device according to some example embodiments of the present disclosure.

Referring to FIG. 1, a display device 10 displays a video or a still image. The display device 10 may refer to all electronic devices that provide display screens. For example, the display device 10 may include televisions, notebooks, monitors, advertising boards, devices for Internet of Things (IoT), mobile phones, smart phones, tablet personal computers (PCs), electronic watches, smart watches, watch phones, head-mounted displays, mobile communication terminals, electronic notebooks, electronic book readers, portable multimedia players (PMPs), navigation devices, game machines, digital cameras, camcorders, and the like, which provide display screens.

The display device 10 includes a display panel that provides a display screen. Examples of the display panel may include a light-emitting diode (LED) display panel, an organic light-emitting display panel, a quantum dot light-emitting display panel, a plasma display panel, a field emission display panel, and the like. Hereinafter, although an example in which the LED display panel as the example of the display panel is described, the present disclosure is not limited thereto, and when the same technical spirit is applicable, it may be applied to other display panels.

A shape of the display device 10 may be variously modified. For example, the display device 10 may have shapes such as a rectangular shape of which lateral sides are long, a rectangular shape of which longitudinal sides are long, a square shape, a quadrangular shape of which corner portions (vertexes) are round, other polygonal shapes, a circular shape, and the like. A shape of a display area DA of the display device 10 may also be similar to an overall shape of the display device 10. In FIG. 1, the display device 10 and the display area DA, which have the rectangular shape of which lateral sides are long, are illustrated.

The display device 10 may include the display area DA and a non-display area NDA. The display area DA is an area in which an image may be displayed, and the non-display area NDA is an area in which an image is not displayed. The display area DA may refer to an active area and the non-display area NDA may refer to an inactive area.

The display area DA may generally occupy a center portion of the display device 10. The display area DA may include a plurality of pixels PX. The plurality of pixels PX may be arranged in a matrix form. A shape of each of the pixels PX may be a rectangular shape or a square shape in a plan view, but the present disclosure is not limited thereto, and may be a rhombus shape of which sides are inclined with respect to a first direction DR1. Each of the pixels PX may include one or more light-emitting elements, which emit light in a specific wavelength range, to display a specific color.

Although not illustrated in the drawing, the plurality of pixels PX may include a first pixel that emits light of a first color, a second pixel that emits light of a second color, and a third pixel that emits light of a third color. In some example embodiments, the first color, the second color, and the third color may be different from each other so that the first color may be blue, the second color may be green, and the third color may be red. However, the present disclosure is not limited thereto, and the plurality of pixels PX may emit light of the same color.

Each of the pixels may include a driving transistor, at least one switching transistor, a light-emitting element, and a capacitor. Because the switching transistor is turned on when a scan signal is applied through a scan line SCL, a data voltage of a data line DTL may be applied to a gate electrode of the driving transistor. The driving transistor supplies a driving current to the light-emitting element according to the data voltage applied to the gate electrode thereof so that the light-emitting element may emit light. The driving transistor and at least one switching transistor may be thin-film transistors (TFTs). The light-emitting element may emit light according to the driving current of the driving transistor. The light-emitting element may be an inorganic light-emitting diode including a semiconductor layer and an active layer. The capacitor may serve to constantly maintain the data voltage applied to the gate electrode of the driving transistor.

Figure 2:
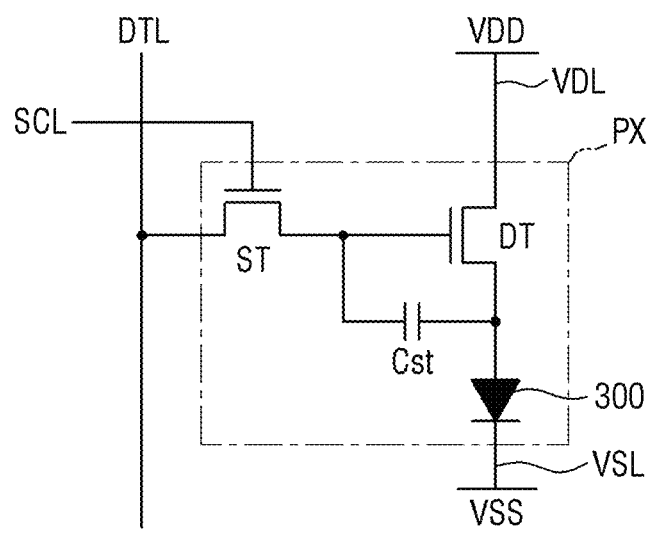
FIG. 2 is an equivalent circuit diagram illustrating one pixel of FIG. 1, according to some example embodiments of the present disclosure.

FIG. 2 is an equivalent circuit diagram illustrating one pixel of FIG. 1, according to some embodiments of the present disclosure.

Referring to FIG. 2, the pixel PX may include a driving transistor DT, a switching transistor ST, a light-emitting element 300, and a capacitor Cst. FIG. 2 illustrates that each pixel PX has a two transistor-one-capacitor (2T1C) structure having one driving transistor DT, one switching transistor ST, and one capacitor Cst, but the present disclosure is not limited thereto. Each pixel PX may include more transistors and a plurality of capacitors.

Each of the driving transistor DT and the switching transistor ST may include one electrode, the other electrode, and a gate electrode. One of the one electrode and the other electrode may be a source electrode, and the other one may be a drain electrode.

Each of the driving transistor DT and the switching transistor ST may be formed of a thin-film transistor (TFT). For example, in FIG. 2, it is illustrated that each of the driving transistor DT and the switching transistor ST is formed of an N-type metal oxide semiconductor field-effect transistor (MOSFET), but the present disclosure is not limited thereto. Each of the driving transistor DT and the switching transistor ST may be formed of a P-type MOSFET. In some embodiments, positions of the source electrode and the drain electrode of each of the driving transistor DT and the switching transistor ST may be changed. Hereinafter, the case in which the driving transistor DT and the first switching transistor ST are formed of N-type MOSFETs will be described as an example.

The driving transistor DT supplies a driving current to the light-emitting element 300 according to a data voltage applied to the gate electrode thereof so that the light-emitting element 300 may emit light. For example, in the driving transistor DT, the gate electrode may be connected to the source electrode of the switching transistor ST, the source electrode may be connected to a first electrode of the light-emitting element 300, and the drain electrode may be connected to a first power line VDL through which a first power voltage is applied.

The switching transistor ST is turned on when a scan signal is applied at the gate electrode of the switching transistor ST through the scan line SCL so that a dlq line DTL may be applied to the gate electrode of the driving transistor DT. For example, in the switching transistor ST, the gate electrode may be connected to the scan line SCL, the source electrode may be connected to the gate electrode of the driving transistor DT, and the drain electrode may be connected to the data line DTL.

The capacitor Cst may be connected between the gate electrode and the source electrode of the driving transistor DT. Accordingly, the capacitor Cst may serve to substantially uniformly maintain the data voltage applied to the gate electrode of the driving transistor DT.

The light-emitting element 300 may emit light according to the driving current of the driving transistor DT. The light-emitting element 300 may include a first electrode and a second electrode. The first electrode of the light-emitting element 300 may be connected to the source electrode of the driving transistor DT and the second electrode of the light-emitting element 300 may be connected to a second power line VSL through which a second power voltage lower than the first power voltage is applied.

Hereinafter, the structure of the display device 10 will be described in detail with reference to other drawings of the present disclosure.

Figure 3:
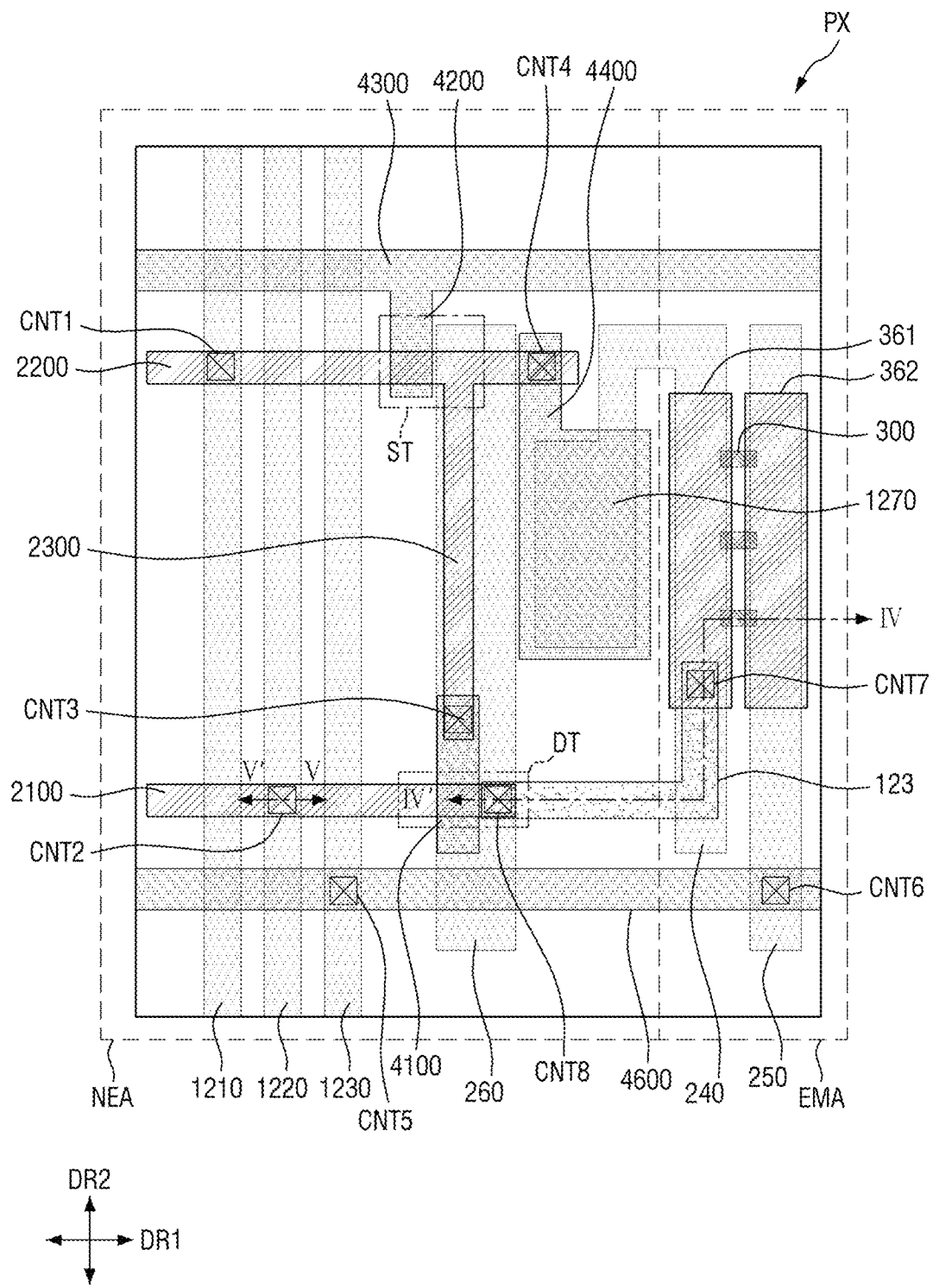
FIG. 3 is a layout diagram illustrating one pixel of the display device, according to some example embodiments of the present disclosure.

FIG. 3 is a layout diagram illustrating one pixel of the display device according to some example embodiments of the present disclosure.

Figure 5:
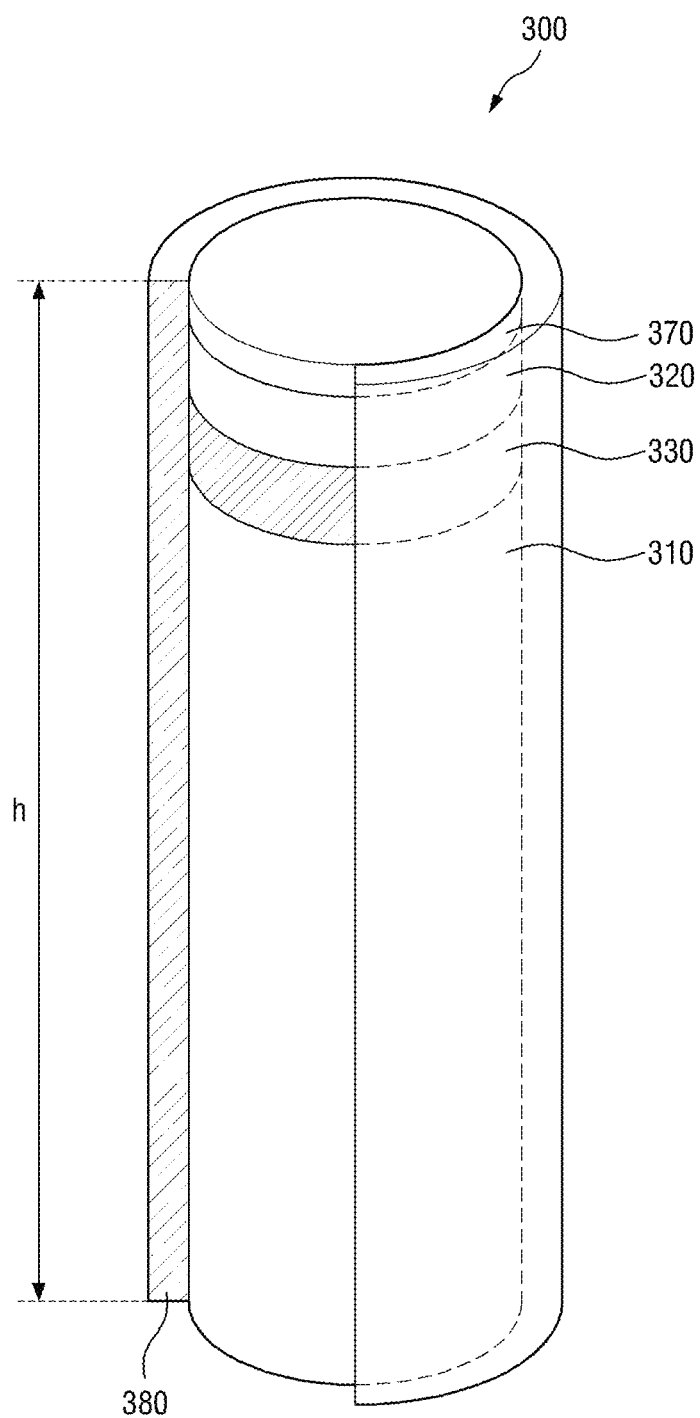
FIG. 5 is a schematic view of a light-emitting element, according to some example embodiments of the present disclosure.

Referring to FIG. 3, each pixel PX of the display device 10 may include an emission area EMA and a non-emission area NEA. The emission area EMA may be defined as an area in which the light-emitting element 300 included in the display device 10 is disposed to emit light in a specific wavelength range. The light-emitting element 300 includes an active layer 330 (e.g., as shown in FIG. 5), and the active layer 330 may emit light in a specific wavelength range without directivity. For example, the light emitted from the active layer 330 of the light-emitting element 300 may also be emitted in directions toward side surfaces of the light-emitting element 300 including both ends thereof. The emission area EMA of each pixel PX may include an area in which the light-emitting element 300 is disposed and an area adjacent to the light-emitting element 300 to which the light is emitted from the light-emitting element 300. Further, the present disclosure is not limited thereto, and the emission area EMA may also include an area to which the light emitted by the light-emitting element 300 is reflected or refracted by another component, element, or member. A plurality of light-emitting elements 300 may be disposed in each pixel PX, and the area in which the light-emitting elements are disposed and areas that are adjacent thereto may together form the emission area EMA.

The non-emission area NEA is an area other than the emission area EMA in each pixel PX. The non-emission area NEA may be defined as an area in which the light-emitting elements 300 are not disposed and the light emitted from the light-emitting elements 300 does not reach so that light is not emitted from the non-emission area NEA. Also, as illustrated in the drawing, a plurality of lines and circuit elements may be disposed in the non-emission area NEA. The driving transistor DT, the switching transistor ST, and the capacitors Cst of each pixel PX, and a plurality of lines may be disposed in the non-emission area NEA.

The display device 10, according to some example embodiments, includes the emission area EMA in which the light-emitting elements 300 are disposed and the non-emission area NEA in which the light-emitting elements 300 are not disposed, and the light-emitting elements 300 that emit light displayed by each pixel PX and the circuit elements for driving the light-emitting elements 300 may be disposed in the areas distinguished from each other. For example, in the display device 10 according to some example embodiments, the light-emitting elements 300 that emit light and the circuit elements for driving the light-emitting elements 300 may be disposed in different areas, for example, disposed in the emission area EMA and the non-emission area NEA, respectively, and may not overlap each other in a thickness direction. The light-emitting element 300 may not overlap at least a first active material layer 126 (for example, see FIG. 4) of the driving transistor DT in the thickness direction, and accordingly, the display device 10 may emit light upward or downward on the basis of the area in which the light-emitting elements 300 are disposed.

In some embodiments, the display device 10 may include a substrate 110 (e.g., see FIG. 4), a semiconductor layer disposed on the substrate 110, a plurality of conductive layers, and the plurality of light-emitting elements 300. In some embodiments, a plurality of insulating layers may be disposed between the semiconductor layer and the conductive layer. The emission area EMA and the non-emission area NEA are defined on the substrate 110, and the semiconductor layer, the conductive layer, and the light-emitting elements 300 may be respectively disposed in the corresponding one of the emission area EMA and the non-emission area NEA.

A first conductive layer may include a data line 1210, a first voltage line 1220, a second voltage line 1230, a first electrode 240, a second electrode 250, a light-shielding layer 260, and a first capacitor electrode 1270. The data line 1210, the first voltage line 1220, the second voltage line 1230, the light-shielding layer 260, and the first capacitor electrode 1270 are disposed in the non-emission area NEA, and the first electrode 240 and the second electrode 250 are disposed in the emission area EMA. The first electrode 240 and the second electrode 250 may be electrically connected to the light-emitting element 300.

The data line 1210 may transfer a data signal to each pixel PX. The data line 1210 may be disposed at one side in the first direction DR1, for example, at a left side in the non-emission area NEA on the basis of a center portion of one pixel PX, and may extend in a second direction DR2. The data line 1210 may extend to another pixel PX positioned adjacent to the one pixel PX in the second direction DR2.

The first voltage line 1220 may transfer a first power voltage VDD to each pixel PX. For example, the first voltage line 1220 may be the first power line VDL of FIG. 2. The first voltage line 1220 may be disposed at one side of the data line 1210 in the non-emission area NEA, for example, at a right side of the data line 1210, and may extend in the second direction DR2. The first voltage line 1220 may extend to another pixel PX positioned adjacent to the one pixel PX in the second direction DR2. The first voltage line 1220 may be in contact with a first semiconductor area 2100 through a second contact hole CNT2, which will be described below, to transfer the first power voltage VDD to the driving transistor DT of each pixel PX.

The second voltage line 1230 may transfer a second power voltage VSS to each pixel PX. For example, the second voltage line 1230 may be the second power line VSL of FIG. 2. The second voltage line 1230 may be disposed at one side of the first voltage line 1220 in the non-emission area NEA, for example, at a right side of the first voltage line 1220, and may extend in the second direction DR2. The second voltage line 1230 may extend to another pixel PX positioned adjacent to the one pixel PX in the second direction DR2. The second voltage line 1230 may be in contact with a conductive line 4600 through a fifth contact hole CNT5, which will be described below, to transfer the second power voltage VSS to the second electrode 250 (e.g., see FIG. 4) of each pixel PX.

The light-shielding layer 260 may be disposed at one side of the second voltage line 1230, for example, at a right side of the second voltage line 1230, and may extend in the second direction DR2. In some embodiments, the light-shielding layer 260 may be electrically connected to the source electrode of the driving transistor DT. The light-shielding layer 260 is disposed to overlap the first active material layer 126 (e.g., see FIG. 4) of the driving transistor DT, which will be described below, to prevent light from being incident on (or to reduce the amount of light incident on) the first active material layer 126. As an example, the light-shielding layer 260 may be made of an opaque metallic material that blocks (or substantially blocks) light from being transmitted.

The first electrode 240 may transfer the first power voltage VDD to the light-emitting element 300. The first electrode 240 may be electrically connected to one end portion of the light-emitting element 300 and the driving transistor DT and may transfer the first power voltage VDD transferred through the first voltage line 1220 to the light-emitting element 300. The first electrode 240 may be disposed at one side in the emission area EMA, for example, a left side in the emission area EMA, which is adjacent to the non-emission area NEA, and may extend in the second direction DR2. Unlike the first voltage line 1220, the first electrode 240 does not extend to another adjacent pixel PX in the second direction DR2 and may be disposed in each pixel PX.

The second electrode 250 may transfer the second power voltage VSS to the light-emitting element 300. The second electrode 250 may be electrically connected to the other end portion of the light-emitting element 300 and the conductive line 4600 and may transfer the second power voltage VSS transferred through the second voltage line 1230 to the light-emitting element 300. The second electrode 250 may be disposed at the other side in the emission area EMA, for example, at a right side in the emission area EMA, which is spaced from the non-emission area NEA, and may extend in the second direction DR2. For example, the second electrode 250 and the first electrode 240 may be spaced from each other and may face each other. The light-emitting element 300 may be disposed in a space between the first electrode 240 and the second electrode 250. Unlike the first voltage line 1220, the second electrode 250 does not extend to another adjacent pixel PX in the second direction DR2 and may be disposed in each pixel PX.

A plurality of electrodes 240 and 250 may be electrically connected to the light-emitting elements 300 and may receive a predetermined voltage (e.g., a set voltage) to allow the light-emitting elements 300 to emit light in a specific wavelength range. In some embodiments, at least a portion of each of the electrodes 240 and 250 may be utilized to form an electric field in the pixel PX, thereby aligning the light-emitting elements 300.

The plurality of electrodes 240 and 250 may include the first electrode 240 and the second electrode 250. In some example embodiments, the first electrode 240 may be a pixel electrode that is separated for each pixel PX, and the second electrode 250 may be a common electrode which is commonly connected along each pixel PX. One of the first electrode 240 and the second electrode 250 may be an anode of the light-emitting element 300, and the other one thereof may be a cathode of the light-emitting element 300. However, the present disclosure is not limited thereto and the reverse of the above description may be possible.

The first capacitor electrode 1270 may be connected to the first electrode 240 and disposed between the first electrode 240 and the light-shielding layer 260 in the non-emission area NEA. The first capacitor electrode 1270 may overlap a second capacitor electrode 4400 with the insulating layer therebetween. Thus, the first capacitor electrode 1270 and the second capacitor electrode 4400 may form the capacitor Cst of FIG. 2.

The first conductive layer may include one or more metals selected from among molybdenum (Mo), aluminum (Al), platinum (Pt), palladium (Pd), silver (Ag), magnesium (Mg), gold (Au), nickel (Ni), neodymium (Nd), iridium (Ir), chrome (Cr), calcium (Ca), titanium (Ti), tantalum (Ta), tungsten (W), and copper (Cu). The first conductive layer may be formed as a single-layer film or a multilayer film. For example, the first conductive layer may be formed in a stacked structure of Ti/Al/Ti, Mo/Al/Mo, Mo/AlGe/Mo, Ti/Cu, and the like.

In some embodiments, each of the electrodes 240 and 250 may include a transparent conductive material. As an example, each of the electrodes 240 and 250 may include materials such as indium tin oxide (ITO), indium zinc oxide (IZO), indium tin-zinc oxide (ITZO), and the like, but the present disclosure is not limited thereto. In some example embodiments, each of the electrodes 240 and 250 may include a conductive material having high reflectance. For example, each of the electrodes 240 and 250 may include a metal such as Ag, Cu, Al, or the like as a material having high reflectance. In some embodiments, light incident on each of the electrodes 240 and 250 may be reflected and emitted in an upward direction with respect to each pixel PX.

Further, each of the electrodes 240 and 250 may be formed in a structure, in which one or more layers of a transparent conductive material and a metal layer having high reflectance are stacked, or formed as a single layer including the transparent conductive material and the metal layer. In some example embodiments, each of the electrodes 240 and 250 may have a stacked structure of ITO/Ag/ITO/IZO or may be an alloy including Al, Ni, lanthanum (La), and the like. However, the present disclosure is not limited thereto.

Figure 4:
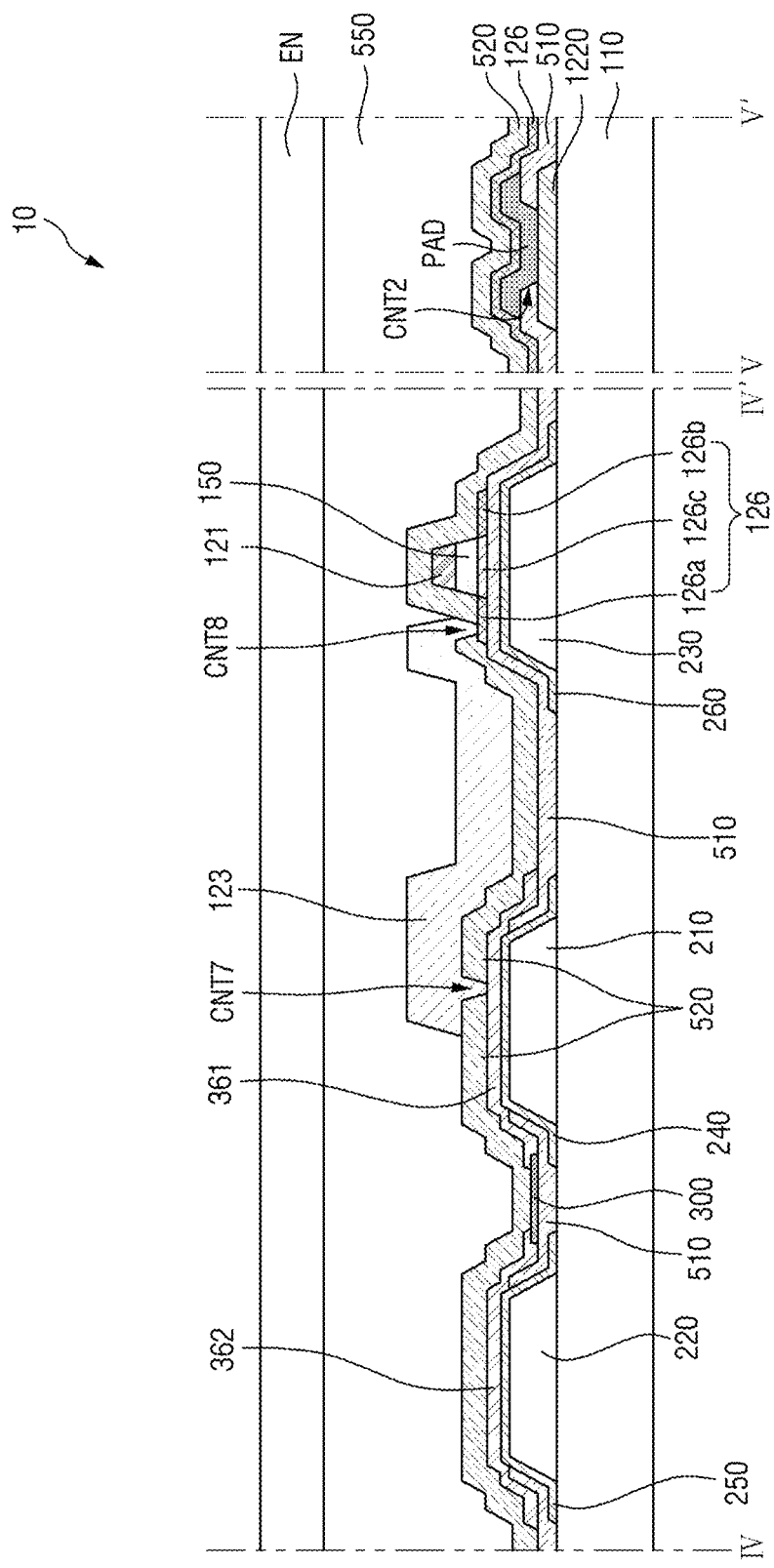
FIG. 4 is a cross-sectional view taken along the lines IV-IV' and V-V' of FIG. 3, according to some example embodiments of the present disclosure.

A first insulating layer 510 is disposed on the first conductive layer (e.g., see FIG. 4). The first insulating layer 510 may be disposed on the first conductive layer and the substrate 110 to cover the first conductive layer and the substrate 110 and may be disposed to partially expose the first electrode 240 and the second electrode 250. A detailed description thereof will be made below.

The light-emitting element 300 may be disposed between the first electrode 240 and the second electrode 250 in the emission area EMA. One end portion of the light-emitting element 300 may be electrically connected to the first electrode 240, and the other end portion thereof may be electrically connected to the second electrode 250. The light-emitting element 300 may be electrically connected to the first electrode 240 and the second electrode 250 through contact electrodes 361 and 362 that will be described below.

The plurality of light-emitting elements 300 may be disposed to be spaced from each other and aligned to be substantially parallel to each other. A separation distance between the light-emitting elements 300 is not particularly limited. In some embodiments, the plurality of light-emitting elements 300 may be disposed adjacent to each other to form a group, and a plurality of other light-emitting elements 300 may be grouped in a state of being spaced at regular intervals and may have a nonuniform density but may be oriented in one direction to be arranged. In some embodiments, the light-emitting element 300 may have a shape extending in one direction, and a direction in which the light-emitting elements 300 extend may be substantially perpendicular to a direction in which each of the electrodes 240 and 250 extends. However, the light-emitting element 300 may be obliquely disposed without being perpendicular or substantially perpendicular to the direction in which each of the electrodes 240 and 250 extends.

The semiconductor layer and the contact electrodes 361 and 362 are disposed on the light-emitting element 300 and the first insulating layer 510. The semiconductor layer includes the first semiconductor area 2100, the second semiconductor area 2200, and a third semiconductor area 2300, which are disposed in the non-emission area NEA, and the contact electrodes 361 and 362 include a first contact electrode 361 disposed on the first electrode 240 and a second contact electrode 362 disposed on the second electrode 250. The first semiconductor area 2100, the second semiconductor area 2200, and the third semiconductor area 2300 may form the active material layer of the switching transistor ST and the driving transistor DT of each pixel PX.

The first semiconductor area 2100 may have a shape that extends in the first direction DR1. As illustrated in the drawing, the first semiconductor area 2100 may extend in the first direction DR1 from a lower side of the pixel PX with respect to the center portion of the pixel PX. The first semiconductor area 2100 may overlap at least the first voltage line 1220 and the light-shielding layer 260. At least a portion of the first semiconductor area 2100 may be electrically connected to the first voltage line 1220 through a second contact hole CNT2 exposing the first voltage line 1220 by passing through the first insulating layer 510 in an area overlapping the first voltage line 1220.

The second semiconductor area 2200 may be spaced from the first semiconductor area 2100 and may have a shape extending in the first direction DR1. As illustrated in the drawing, the second semiconductor area 2200 may extend in the first direction DR1 from an upper side of the pixel PX with respect to the center portion of the pixel PX. The second semiconductor area 2200 may overlap at least the data line 1210. At least a portion of the second semiconductor area 2200 may be electrically connected to the data line 1210 through a first contact hole CNT1 exposing the data line 1210 by passing through the first insulating layer 510 in an area overlapping the data line 1210. In some embodiments, like the first semiconductor area 2100, the second semiconductor area 2200 may partially overlap the light-shielding layer 260.

The third semiconductor area 2300 may be connected to the second semiconductor area 2200 and may be branched from the semiconductor area 2200, and extend in the second direction DR2 toward the first semiconductor area 2100. The third semiconductor area 2300 extends in the second direction DR2 at a position adjacent to the center portion of the pixel PX and may be terminated such that the third semiconductor area 2300 is spaced from the first semiconductor area 2100. The third semiconductor area 2300 may be electrically connected to a first gate electrode of the driving transistor DT, which will be described below.

The plurality of contact electrodes 361 and 362 may have shapes in which at least a portion thereof extend in one direction. The plurality of contact electrodes 361 and 362 may be in contact with the light-emitting elements 300 and the electrodes 240 and 250, respectively, and the light-emitting elements 300 may receive electrical signals from the first electrode 240 and the second electrode 250 through the contact electrodes 361 and 362.

The contact electrodes 361 and 362 may include the first contact electrode 361 and the second contact electrode 362. The first contact electrode 361 and the second contact electrode 362 may be disposed on the first electrode 240 and the second electrode 250, respectively.

The first contact electrode 361 may be disposed on the first electrode 240, may extend in the second direction DR2, and may be in contact with one end portion of each of the light-emitting elements 300. The second contact electrode 362 may be spaced from the first contact electrode 361 in the first direction DR1, may be disposed on the second electrode 250, may extend in the second direction DR2, and may be in contact with the other end portion of each of the light-emitting elements 300. The first contact electrode 361 and the second contact electrode 362 may be in contact with the first electrode 240 and the second electrode 250, which are exposed because the first insulating layer 510 is not disposed thereon. The light-emitting elements 300 may be electrically connected to the first electrode 240 and the second electrode 250 through the first contact electrode 361 and the second contact electrode 362.

In some embodiments, widths of the first contact electrode 361 and the second contact electrode 362 measured in one direction, may be greater than widths of the first electrode 240 and the second electrode 250 measured in the one direction. The first contact electrode 361 and the second contact electrode 362 may be disposed to cover side portions of the first electrode 240 and the second electrode 250. However, the present disclosure is not limited thereto, and in some embodiments, the first contact electrode 361 and the second contact electrode 362 may be disposed to cover only one side portions of the first electrode 240 and the second electrode 250. The contact electrodes 361 and 362 may include a conductive material. For example, the contact electrodes 361 and 362 may include ITO, IZO, ITZO, Al, or the like. However, the present disclosure is not limited thereto.

In some embodiments, as described above, the active material layer of the first semiconductor area 2100 or the second semiconductor area 2200, that is, the driving transistor DT and the switching transistor ST, may include polycrystalline silicon or an oxide semiconductor. The contact electrodes 361 and 362 may also include an oxide semiconductor having conductivity in some embodiments. The contact electrodes 361 and 362 and the first active material layer 126 (see FIG. 4) of the driving transistor DT may be disposed in substantially the same layer, and in some example embodiments, the contact electrodes 361 and 362 and the first active material layer 126 may include the same material. In the display device 10 according to some example embodiments, the driving transistor DT of each pixel PX is disposed above the light-emitting element 300, and the contact electrodes 361 and 362 in contact with the first active material layer 126 of the driving transistor DT and the light-emitting element 300 may be formed in the same process. Accordingly, the number of fabrication processes of the display device 10 may be reduced. A detailed description thereof will be made below with reference to other drawings.

A second conductive layer is disposed on the semiconductor layer. The second conductive layer may include a first gate electrode 4100, a second gate electrode 4200, a scan signal line 4300, a second capacitor electrode 4400, and the conductive line 4600, which are disposed in the non-emission area NEA. The first gate electrode 4100, the second gate electrode 4200, and the second capacitor electrode 4400 may be disposed in the non-emission area NEA, and the scan signal line 4300 and the conductive line 4600 may be disposed over the non-emission area NEA and the emission area EMA.

The first gate electrode 4100 is disposed to overlap the first semiconductor area 2100, the third semiconductor area 2300, and the light-shielding layer 260 in the non-emission area NEA. The first gate electrode 4100 may form the gate electrode of the driving transistor DT in an area overlapping the first semiconductor area 2100. In some embodiments, the first gate electrode 4100 may be in contact with the third semiconductor area 2300 through a third contact hole CNT3 in an area overlapping the third semiconductor area 2300, and the gate electrode of the driving transistor DT may be connected to one electrode of the switching transistor ST.

The scan signal line 4300 may transfer the scan signal to the switching transistor ST of each pixel PX. The scan signal line 4300 may extend in the first direction DR1, and the second gate electrode 4200 may be branched from the scan signal line 4300 and extend in the second direction DR2. The scan signal line 4300 extends in the first direction DR1 at the upper side of the pixel PX in the drawing. The scan signal line 4300 may extend to another pixel PX positioned adjacent to one pixel PX in the first direction DR1.

The second gate electrode 4200 may be branched from at least a portion of the scan signal line 4300 in the second direction DR2. The second gate electrode 4200 may be disposed to overlap a portion of the second semiconductor area 2200. The second gate electrode 4200 may form the gate electrode of the switching transistor ST. The scan signal line 4300 may transfer the scan signal to the switching transistor ST through the second gate electrode 4200.

The second capacitor electrode 4400 may be disposed to overlap the first capacitor electrode 1270 in the non-emission area NEA. The second capacitor electrode 4400 and the first capacitor electrode 1270 may form the capacitor Cst of each pixel PX. In some embodiments, the second capacitor electrode 4400 may overlap one side of the second semiconductor area 2200 and may be in contact with the second semiconductor area 2200 through the fourth contact hole CNT4.

The conductive line 4600 may be disposed at the lower side of the pixel PX with respect to the center portion of the pixel PX and may also be disposed in another adjacent pixel in the first direction DR1 by extending in the first direction DR1. The conductive line 4600 may overlap the second voltage line 1230 and may be in contact with the second voltage line 1230 through the fifth contact hole CNT5. In some embodiments, the conductive line 4600 may overlap the second electrode 250 and may be in contact with the second electrode 250 through a sixth contact hole CNT6. Accordingly, the second power voltage applied to the second voltage line 1230 may be transmitted to the second electrode 250 through the conductive line 4600.

The second conductive layer may include one or more metals selected from among Mo, Al, Pt, Pd, Ag, Mg, Au, Ni, Nd, Ir, Cr, Ca, Ti, Ta, W, and Cu. The second conductive layer may be formed as a single-layer film or a multilayer film. For example, the second conductive layer may be formed in a stacked structure of Ti/Al/Ti, Mo/Al/Mo, Mo/AlGe/Mo, Ti/Cu, and the like.

A second insulating layer 520 is disposed on the second conductive layer and the contact electrodes 361 and 362 (e.g., see FIG. 4). The second insulating layer 520 may be disposed on the second conductive layer and the contact electrodes 361 and 362 to cover the second conductive layer and the contact electrodes 361 and 362, and contact holes CNT7 and CNT8 passing through the second insulating layer 520 and exposing portions of the contact electrodes 361 and 362 or the first active material layer 126 may be formed in the second insulating layer 520. A detailed description thereof will be made below.

A third conductive layer is disposed on the second insulating layer 520. The driving transistor DT and the one electrode of the switching transistor ST are disposed in the third conductive layer. In the drawing, only an one electrode 123 of the driving transistor DT is illustrated, but the present disclosure is not limited thereto, and the third conductive layer may include an one electrode of the switching transistor ST.

The one electrode 123 of the driving transistor DT may be disposed to overlap one side of the first semiconductor area 2100, that is, one side of the first active material layer 126 of the driving transistor DT in the non-emission area NEA, and may be disposed to overlap the first contact electrode 361 in the emission area EMA. The one electrode 123 may be in contact with a portion of the first semiconductor area 2100 through an eighth contact hole CNT8 exposing a portion of the first semiconductor area 2100 by passing through the second insulating layer 520. In some embodiments, the one electrode 123 may be in contact with a portion of the first contact electrode 361 through a seventh contact hole CNT7 exposing a portion of the first contact electrode 361 by passing through the second insulating layer 520. Thus, the driving transistor DT of the pixel PX may be electrically connected to one end portions of the first contact electrode 361, the first electrode 240, and the light-emitting element 300.

Hereinafter, the structure of the display device 10 will be described in detail with reference to another drawing.

FIG. 4 is a cross-sectional view taken along lines IV-IV' and V-V' of FIG. 3, according to some embodiments of the present disclosure.

FIG. 4 illustrates cross sections of partial areas of the members illustrated in FIG. 3 to illustrate the arrangement of the driving transistor DT, the first electrode 240, the second electrode 250, and the light-emitting element 300 of each pixel PX. For example, FIG. 4 illustrates cross sections crossing a portion of the first semiconductor area 2100 and both end portions of one light-emitting element 300 in the non-emission area NEA. In some embodiments, some of the members illustrated in FIG. 4 have been given new reference numerals different from those in FIG. 3 for the convenience of description.

Referring to FIG. 4, the display device 10 includes the substrate 110, a plurality of banks 210, 220, and 230 disposed on the substrate 110, the first electrode 240, the second electrode 250, the light-emitting element 300, the first contact electrode 361, the second contact electrode 362, and the driving transistor DT. In some embodiments, the display device 10 may include the first insulating layer 510 and the second insulating layer 520, which are disposed on the substrate 110.

In some embodiments, the substrate 110 may be an insulating substrate. The substrate 110 may be made of an insulating material such as glass, quartz, a polymer resin, or the like. The substrate 110 may be a rigid substrate but may also be a flexible substrate that is bendable, foldable, rollable, or the like.

The plurality of banks 210, 220, and 230 may be disposed on the substrate 110. The plurality of banks 210, 220, and 230 include a first bank 210, a second bank 220, and a third bank 230, which are disposed to be spaced from each other. The first conductive layer, which will be described below, may be disposed above the plurality of banks 210, 220, and 230. Although not illustrated in the drawing, the first bank 210, the second bank 220, and the third bank 230 may each have a shape extending in one direction, for example, in the second direction DR2, within each pixel PX.

The plurality of banks 210, 220, and 230 may each have a structure at least partially protruding from the substrate 110. The banks 210, 220, and 230 may each protrude upward from a plane on which the light-emitting element 300 is disposed, and at least some portion of the protruding portions may have an inclination. The shape of each of the banks 210, 220, and 230 is not particularly limited. Because the banks 210, 220, and 230 each have inclined side surfaces protruding from the substrate 110, the light emitted from the light-emitting element 300 may be reflected at the inclined side surfaces of each of the banks 210, 220, and 230. As will be described below, when the electrodes 240 and 250 disposed on the banks 210, 220, and 230 include a material having high reflectance, the light emitted from the light-emitting element 300 may be reflected at the electrodes 240 and 250, which are positioned on the inclined side surfaces of the banks 210, 220, and 230 to travel in an upward direction. For example, the banks 210, 220, and 230 may perform a function of a reflective partition wall that reflects the light emitted from the light-emitting element 300 in the upward direction. However, the present disclosure is not limited thereto. In some embodiments, the plurality of banks 210, 220, and 230 may include polyimide (PI), but the present disclosure is not limited thereto.

In some example embodiments, the plurality of banks 210, 220, and 230 may be made of a conductive material. In some embodiments, the banks 210, 220, and 230 may form one conductive layer, and the first conductive layer, for example, the first electrode 240, the second electrode 250, and the light-shielding layer 260, which are disposed on the banks 210, 220, and 230, may be integrated with the banks 210, 220, and 230 to form the one electrodes 240 and 250 or the light-shielding layer 260. For example, when the third bank 230 includes a conductive material, for example, a light-shielding material such as a metal, the separate light-shielding layer 260 may be omitted, and the third bank 230 may perform a function of shielding light incident on the first active material layer 126.

The light-shielding layer 260, the first electrode 240, and the second electrode 250 of the first conductive layer are disposed on the banks 210, 220, and 230.

The light-shielding layer 260 may be disposed on the third bank 230 in the non-emission area NEA. The first electrode 240 and the second electrode 250 may be disposed on the first bank 210 and the second bank 220, respectively, in the emission area EMA. Each of the light-shielding layer 260, the first electrode 240, and the second electrode 250 may have a width that is greater than that of each of the banks 210, 220, and 230, and at least a portion thereof may be disposed on the banks 210, 220, and 230, and another portion thereof may be disposed on the substrate 110.

The first insulating layer 510 may be disposed on the first electrode 240, the second electrode 250, and the light-shielding layer 260. In some example embodiments, the first insulating layer 510 may be disposed to expose flat top surfaces of the first electrode 240 and the second electrode 250, for example, at least portions thereof disposed on the top surfaces of the first bank 210 and the second bank 220. On the other hand, the first insulating layer 510 may be disposed to cover a top surface of the light-shielding layer 260. Unlike the first electrode 240 and the second electrode 250, the entire surface of the light-shielding layer 260 may be covered by the first insulating layer 510 without exposing the top surface thereof. The first active material layer 126 of the driving transistor DT may be disposed on the light-shielding layer 260 with the first insulating layer 510 therebetween.

The first insulating layer 510 may protect the first electrode 240 and the second electrode 250 and, concurrently (e.g., simultaneously), insulate the first electrode 240 from the second electrode 250. In some embodiments, the light-emitting element 300 disposed on the first insulating layer 510 may be prevented or protected from being damaged by being in direct contact with other members. However, the shape and structure of the first insulating layer 510 are not limited thereto.

In some example embodiments, the first insulating layer 510 may be formed such that a portion thereof disposed between the first electrode 240 and the second electrode 250 has a flat top surface. The flat top surface of the first insulating layer 510 extends in one direction toward the first electrode 240 and the second electrode 250, and the first insulating layer 510 may also be disposed in areas in which the electrodes 240 and 250 overlap the inclined side surfaces of the first bank 210 and the second bank 220, respectively. Each of the contact electrodes 361 and 362 may be in contact with the exposed areas of the first electrode 240 and the second electrode 250 and may be smoothly in contact with an end portion of the light-emitting element 300 on the flat top surface of the first insulating layer 510.

However, the present disclosure is not limited thereto. A step may be formed in the portion of the first insulating layer 510, which is disposed between the first electrode 240 and the second electrode 250, such that a portion of the top surface of the first insulating layer 510 is recessed. The first insulating layer 510 may include an inorganic insulating material, and the portion of the top surface of the first insulating layer 510, which is disposed to cover the first electrode 240 and the second electrode 250, may be recessed due to the step formed by the electrodes 240 and 250 disposed below the first insulating layer 510. The light-emitting element 300 may be disposed on the first insulating layer 510 between the first electrode 240 and the second electrode 250, and an empty space may be formed between the light-emitting element 300 and the recessed top surface of the first insulating layer 510. The light-emitting element 300 may be disposed in a state of being partially separated from the top surface of the first insulating layer 510. The empty space between the top surface of the first insulating layer 510 and the light-emitting element 300 may be filled with a material of the second insulating layer 520 disposed on the light-emitting element 300.

The first active material layer 126 of the driving transistor DT, the light-emitting element 300, and the contact electrodes 361 and 362 are disposed on the first insulating layer 510.

The light-emitting element 300 may be disposed on the first insulating layer 510 between the electrodes 240 and 250. However, the present disclosure is not limited thereto, and, although not shown in the drawing, at least some of the light-emitting elements 300 disposed in the pixel PX may be disposed in an area except for the area between the electrodes 240 and 250. In some embodiments, the light-emitting element 300 may be disposed such that at least portion thereof overlaps the electrodes 240 and 250. Both end portions of the light-emitting element 300 may be disposed on the end portion of the first electrode 240 and the end portion of the second electrode 250, which are facing each other.

The light-emitting element 300 may include a plurality of layers arranged along a direction parallel to the substrate 110. The light-emitting element 300 of the display device 10 according to some example embodiments may have a shape extending in one direction and have a structure in which a plurality of semiconductor layers are sequentially disposed in one direction. In the light-emitting element 300, a first semiconductor layer 310, the active layer 330, a second semiconductor layer 320, and an electrode layer 370 may be sequentially disposed in one direction, and an insulating film 380 may surround outer surfaces of the first semiconductor layer 310, the active layer 330, the second semiconductor layer 320, and the electrode layer 370 (e.g., see FIG. 5). The light-emitting element 300 disposed in the display device 10 may be disposed such that an extending one direction thereof is parallel to the substrate 110, and the plurality of semiconductor layers included in the light-emitting element 300 may be sequentially arranged along a direction parallel to a top surface of the substrate 110. However, the present disclosure is not limited thereto. In some embodiments, when the light-emitting element 300 has a different structure, the plurality of semiconductor layers may be arranged along a direction perpendicular to the substrate 110. A detailed description of the light-emitting element 300 will be made below with reference to other drawings.

Also, one end portion of the light-emitting element 300 may be in contact with the first contact electrode 361 and the other end portion thereof may be in contact with the second contact electrode 362. According to some example embodiments, because the insulating film 380 is not formed on the extending end surfaces of the light-emitting element 300 in one direction and the extending end surfaces thereof are exposed, the exposed end surfaces may be in contact with the first contact electrode 361 and the second contact electrode 362, which will be described below. However, the present disclosure is not limited thereto. In some embodiments, at least a portion of the insulating film 380 is removed from the light-emitting element 300, and the insulating film 380 is removed such that side surfaces of both end portions of the light-emitting element 300 may be partially exposed. In some embodiments, the exposed side surfaces of the light-emitting element 300 may be in contact with the first contact electrode 361 and the second contact electrode 362. However, the present disclosure is not limited thereto.

In some embodiments, a third insulating layer 530_3 (see FIG. 20) may be further disposed on the light-emitting element 300. The third insulating layer 530_3 may be disposed to expose both end portions of the light-emitting elements 300 and may fix the light-emitting elements 300 so that the light-emitting elements 300 do not move during a fabricating process of the display device 10. A description thereof will be made below.

The first active material layer 126 of the driving transistor DT is disposed on the first insulating layer 510 overlapping the light-shielding layer 260. The first active material layer 126 may be an area of the first semiconductor area 2100 that overlaps the light-shielding layer 260. The first active material layer 126 may include a first conductive area 126a, a second conductive area 126b, and a channel area 126c. The channel area 126c may be disposed between the first conductive area 126a and the second conductive area 126b. According to some example embodiments, the first active material layer 126 may include an oxide semiconductor. In some embodiments, the oxide semiconductor may be an oxide semiconductor containing indium (In). In some example embodiments, the oxide semiconductor may include ITO, IZO, indium-gallium oxide (IGO), indium-zinc-tin oxide (IZTO), indium-gallium-tin oxide (IGTO), indium-gallium-zinc-tin oxide (IGZTO), or the like. However, the present disclosure is not limited thereto. The first conductive area 126a and the second conductive area 126b may be areas in which at least a portion of the first active material layer 126 becomes conductive. Accordingly, the first conductive area 126a and the second conductive area 126b may be source or drain areas of the first active material layer 126. The second conductive area 126b may be a drain area when the first conductive area 126a is a source area, and the second conductive area 126b may be a source area when the first conductive area 126a is a drain area. However, the present disclosure is not limited thereto.

However, the first active material layer 126 is not necessarily limited to the above description. In some example embodiments, the first active material layer 126 may include polycrystalline silicon. In some embodiments, the first conductive area 126a may be a first doped area, and the second conductive area 126b may be a second doped area. The polycrystalline silicon may be formed by crystallizing amorphous silicon. Non-limiting examples of the crystallization method may include a rapid thermal annealing (RTA) method, a solid phase crystallization (SPC) method, an excimer laser annealing (ELA) method, a metal-induced crystallization (MILC) method, a sequential lateral solidification (SLS) method, and the like, but the present disclosure is not limited thereto. As another example, the first active material layer 126 may include single-crystalline silicon, low-temperature polycrystalline silicon, amorphous silicon, or the like.

In some embodiments, the first active material layer 126 or the first semiconductor area 2100 may be electrically connected to the first voltage line 1220. A pad electrode PAD may be disposed on the first voltage line 1220 exposed through the second contact hole CNT2, and the first active material layer 126 of the driving transistor DT may be in contact with the pad electrode PAD. Thus, the driving transistor DT may be electrically connected to the first voltage line 1220.

A gate insulating layer 150 and a gate electrode 121 of the driving transistor DT are disposed on the first active material layer 126. The gate electrode 121 may overlap the channel area 126c of the first active material layer 126 with the gate insulating layer 150 therebetween. As described above, the gate electrode 121 may be the first gate electrode 4100 of the third conductive layer.

The contact electrodes 361 and 362 are disposed on the first electrode 240 and the second electrode 250, respectively. The first contact electrode 361 is disposed on the first electrode 240, and the second contact electrode 362 is disposed on the second electrode 250. In some embodiments, at least portions of the contact electrodes 361 and 362 are disposed on the first insulating layer 510. The first contact electrode 361 may be in contact with the exposed area of the first electrode 240 on the first bank 210, and the second contact electrode 362 may be in contact with the exposed area of the second electrode 250 on the second bank 220. As described above, the first contact electrode 361 and the second contact electrode 362 may be in contact with at least one end portion of the light-emitting element 300 and electrically connected to the first electrode 240 or the second electrode 250 to receive an electrical signal.

The second insulating layer 520 is disposed on the contact electrodes 361 and 362 and the gate electrode 121 of the driving transistor DT. The second insulating layer 520 may be disposed on the entire surface of the substrate 110 and may be disposed to cover the contact electrodes 361 and 362, the gate electrode 121 of the driving transistor DT, and the light-emitting element 300. In some embodiments, as described above, the seventh contact hole CNT7 exposing a portion of the first contact electrode 361 by passing through the second insulating layer 520, and the eighth contact hole CNT8 exposing one side of the first active material layer 126 may be formed on the second insulating layer 520. The one electrode 123 of the driving transistor DT may be disposed on the second insulating layer 520 and may be in contact with the first doped area 126a, which is one side of the first active material layer 126, and the first contact electrode 361 through the contact holes CNT7 and CNT8, respectively.

A passivation layer 550 may be disposed on the second insulating layer 520 and the one electrode 123 of the driving transistor DT. The passivation layer 550 may serve to protect members disposed on the substrate 110 from an external environment.

The first insulating layer 510, the second insulating layer 520, and the passivation layer 550, which are described above, may each include an inorganic insulating material or an organic insulating material. In some example embodiments, the first insulating layer 510, the second insulating layer 520, and the passivation layer 550 may each include an inorganic insulating material such as silicon oxide (SiOx), silicon nitride (SiNx), silicon oxynitride (SiOxNy), aluminum oxide ($Al_2O_3$), aluminum nitride (AlN), or the like. Further, the first insulating layer 510, the second insulating layer 520, and the passivation layer 550 may each include acrylic resin, epoxy resin, phenol resin, polyamide resin, polyimide resin, unsaturated polyester resin, polyphenylene resin, polyphenylene sulfide resin, benzocyclobutene, cardo resin, siloxane resin, silsesquioxane resin, polymethylmethacrylate, polycarbonate, polymethylmethacrylate-polycarbonate synthetic resin, or the like as an organic insulating material. However, the present disclosure is not limited thereto.

In some embodiments, an encapsulation layer EN may be disposed on the passivation layer 550. In some example embodiments, the encapsulation layer EN may be a thin-film encapsulation layer including at least one encapsulation film. For example, the encapsulation layer EN may include a first inorganic film, an organic film, and a second inorganic film. The first inorganic film and the second inorganic film may each include silicon nitride, silicon oxide, or silicon oxynitride. The organic film may include an organic insulation material such as acryl resin, epoxy resin, phenolic resin, polyamide resin, polyimide resin, unsaturated polyester resin, polyphenylene ether resin, polyphenylene sulfide resin, benzocyclobutene (BCB), or the like.

FIG. 5 is a schematic view of the light-emitting element according to some example embodiments of the present disclosure.

The light-emitting element 300 may be a light-emitting diode, and in some embodiments, may be an inorganic light-emitting diode having a size of a micrometer unit or a nanometer unit and made of an inorganic material. The inorganic light-emitting diode may be aligned between two electrodes in which polarity is formed by forming an electric field in a specific direction between the two electrodes facing each other. The light-emitting element 300 may be aligned between two electrodes due to an electric field formed on the two electrodes.

The light-emitting element 300 according to some example embodiments may have a shape extending in one direction. The light-emitting element 300 may have a shape of a rod, a wire, a tube, or the like. In some example embodiments, the light-emitting element 300 may have a cylindrical shape or a rod shape. However, the shape of the light-emitting element 300 is not limited thereto, and the light-emitting element 300 may have a shape of a cube, a rectangular parallelepiped, a polygonal pillar such as a hexagonal pillar or the like or have a shape which extends in one direction and has a partially inclined outer surface. Thus, the light-emitting element 300 may have various shapes. A plurality of semiconductors included in the light-emitting element 300, which will be described below, may have a structure in which the semiconductors are sequentially arranged or stacked along the one direction.

The light-emitting element 300 may include a semiconductor layer doped with an arbitrary conductive-type (for example, p-type or n-type) impurity. The semiconductor layer may receive an electric signal applied from an external power source and emit light in a specific wavelength range.

The light-emitting element 300 according to some example embodiments may emit light in a specific wavelength range. In some example embodiments, the active layer 330 may emit blue light having a central wavelength band ranging from 450 nm to 495 nm. However, the central wavelength band of the blue light is not limited to the above-described range, and it should be understood that the central wavelength band includes all wavelength ranges that can be recognized as a blue color in the art. Further, the light emitted from the active layer 330 of the light-emitting element 300 is not limited thereto, and the light may be green light having a central wavelength band ranging from 495 nm to 570 nm or red light having a central wavelength band ranging from 620 nm to 750 nm. Hereinafter, an example in which the light-emitting element 300 emits blue light will be described.

Referring to FIG. 5, the light-emitting element 300 may include a semiconductor core and the insulating film 380 surrounding the semiconductor core, and the semiconductor core of the light-emitting element 300 may include the first semiconductor layer 310, the second semiconductor layer 320, and the active layer 330. For example, the light-emitting element 300 according to some example embodiments may further include the electrode layer 370 disposed on one surface of the first semiconductor layer 310 or the second semiconductor layer 320.

The first semiconductor layer 310 may be an n-type semiconductor. As an example, when the light-emitting element 300 emits light in a blue wavelength range, the first semiconductor layer 310 may include a semiconductor material having a chemical formula of $Al_xGa_yIn_{1-x-y}N$ ($0 \leq x \leq 1$, $0 \leq y \leq 1$, and $0 \leq x+y \leq 1$). For example, the semiconductor material may be one or more from among AlGaInN, GaN, AlGaN, InGaN, AlN, and InN that are doped with an n-type impurity. The first semiconductor layer 310 may be doped with an n-type dopant. As an example, the n-type dopant may be Si, Ge, Sn, or the like. In some example embodiments, the first semiconductor layer 310 may be n-GaN doped with n-type Si. A length of the first semiconductor layer 310 may range from 1.5 μm to 5 μm, but the present disclosure is not limited thereto.

The second semiconductor layer 320 is disposed on the active layer 330 that will be described below. The second semiconductor layer 320 may be a p-type semiconductor. As an example, when the light-emitting element 300 emits light in a blue or green wavelength range, the second semiconductor layer 320 may include a semiconductor material having a chemical formula of $Al_xGa_yIn_{1-x-y}N$ ($0 \leq x \leq 1$, $0 \leq y \leq 1$, and $0 \leq x+y \leq 1$). For example, the semiconductor material may be one or more from among AlGaInN, GaN, AlGaN, InGaN, AlN, and InN that are doped with a p-type impurity. The second semiconductor layer 320 may be doped with a p-type dopant. As an example, the p-type dopant may be Mg, Zn, Ca, selenium (Se), barium (Ba), or the like. In some example embodiments, the second semiconductor layer 320 may be p-GaN doped with p-type Mg. A length of the second semiconductor layer 320 may range from 0.05 μm to 0.10 μm, but the present disclosure is not limited thereto.

In some embodiments, the first semiconductor layer 310 and the second semiconductor layer 320 are illustrated in the drawing as being formed of one layer, but the present disclosure is not limited thereto. According to some example embodiments, the first semiconductor layer 310 and the second semiconductor layer 320 may further include a greater number of layers, e.g., a clad layer or a tensile strain barrier reducing (TSBR) layer according to a material of the active layer 330. A description thereof will be made below with reference to other drawings.

The active layer 330 is disposed between the first semiconductor layer 310 and the second semiconductor layer 320. The active layer 330 may include a material having a single or multiple quantum well structure. When the active layer 330 includes a material having a multiple quantum well structure, the active layer 330 may have a structure in which a quantum layer and a well layer are alternately stacked. The active layer 330 may emit light due to a combination of electron-hole pairs in response to electrical signals applied through the first semiconductor layer 310 and the second semiconductor layer 320. As an example, when the active layer 330 emits light in a blue wavelength range, the active layer 330 may include a material such as AlGaN, AlGaInN, or the like. For example, when the active layer 330 has a multiple quantum well structure in which a quantum layer and a well layer are alternately stacked, the quantum layer may include a material such as AlGaN or AlGaInN, and the well layer may include a material such as GaN or AlInN. In some example embodiments, the active layer 330 includes AlGaInN as a quantum layer and AlInN as a well layer. As described above, the active layer 330 may emit blue light having a central wavelength band ranging from 450 nm to 495 nm.

However, the present disclosure is not limited thereto, and the active layer 330 may have a structure in which a semiconductor material having large bandgap energy and a semiconductor material having small bandgap energy are alternately stacked or include other group III or group V semiconductor materials according to the wavelength range of emitted light. The light emitted by the active layer 330 is not limited to light in a blue wavelength band, and the active layer 330 may also emit light in a red or green wavelength band in some embodiments. A length of the active layer 330 may range from 0.05 μm to 0.10 μm, but the present disclosure is not limited thereto.

In some embodiments, the light emitted from the active layer 330 may be emitted to not only an outer surface of the light-emitting element 300 in a lengthwise direction but also the both side surfaces of the light-emitting element 300. Directivity of the light emitted from the active layer 330 is not limited to one direction.

The electrode layer 370 may be an ohmic contact electrode. However, the present disclosure is not limited thereto, and the electrode layer 370 may be a Schottky contact electrode. The light-emitting element 300 may include at least one electrode layer 370. Although the light-emitting element 300 is illustrated in FIG. 5 as including a single electrode layer 370, the present disclosure is not limited thereto. In some embodiments, the light-emitting element 300 may include a greater number of electrode layers 370, or the electrode layer 370 may be omitted. The description of the light-emitting element 300, which will be made below, may be identically applied even when the number of electrode layers 370 is varied or another structure is further included.

In the display device 10 according to some example embodiments, when the light-emitting element 300 is electrically connected to the electrode or the contact electrode, the electrode layer 370 may decrease the resistance between the light-emitting element 300 and the electrode or between the light-emitting element 300 and the contact electrode (e.g., 361, 362 as shown in FIG. 4). The electrode layer 370 may include a conductive metal. For example, the electrode layer 370 may include at least one from among Al, Ti, In, Au, Ag, ITO, IZO, and ITZO. Further, the electrode layer 370 may include a semiconductor material doped with an n-type or p-type impurity. The electrode layer 370 may include the same material or different materials. A length of the electrode layer 370 may range from 0.02 μm to 0.01 μm, but the present disclosure is not limited thereto.

The insulating film 380 is disposed to surround some of the outer surfaces (e.g., side surfaces) of the semiconductor core and the electrode layer 370. In some example embodiments, the insulating film 380 may be disposed to surround at least the outer surface of the active layer 330 and may extend in one direction in which the light-emitting element 300 extends. The insulating film 380 may serve to protect the members. For example, the insulating film 380 may be formed to surround side surface portions of the members and to expose both end portions of the light-emitting element 300 in the lengthwise direction (e.g., the top surface of the electrode layer 370 may be devoid of the insulating film 380 and may be exposed).

In the drawing, the insulating film 380 is illustrated as being formed to extend in the lengthwise direction of the light-emitting element 300 to cover from a body portion of the first semiconductor layer 310 to a side surface of the electrode layer 370, but the present disclosure is not limited thereto. Because the insulating film 380 covers only the outer surfaces of some semiconductor layers including the active layer 330 or covers only a portion of the outer surface of the electrode layer 370, the outer surface of the electrode layer 370 may be partially exposed. In some embodiments, a top surface of the insulating film 380 may be formed to be rounded in cross section in an area adjacent to at least one end portion of the light-emitting element 300.

The insulating film 380 may include an insulating material such as $SiO_x$, $SiN_x$, $SiO_xN_y$, AlN, $Al_2O_3$, or the like. Accordingly, it is possible to prevent (or reduce the chance of) an electrical short circuit which may occur when the active layer 330 is in direct contact with an electrode through which an electrical signal is transmitted to the light-emitting element 300. Further, because the insulating film 380 protects the outer surface of the light-emitting element 300 including the active layer 330, it is possible to prevent or reduce degradation in light emission efficiency.

Further, in some example embodiments, an outer surface of the insulating film 380 may be surface treated. During the fabrication of the display device 10, the light-emitting elements 300 may be aligned by being injected onto the electrodes in a state of being dispersed in a predetermined (or set) ink. Here, in order to allow the light-emitting element 300 to maintain the dispersed state in the ink without being agglomerated with another adjacent light-emitting element 300, the surface of the insulating film 380 may be hydrophobically or hydrophilically treated.

The insulating film 380 may protect the semiconductor core including at least the active layer 330 of the light-emitting element 300. As described above, during the fabricating process of the light-emitting element 300, and during the fabricating process of the display device 10, the insulating film 380 may be partially etched to have a smaller thickness. When the insulating film 380 has a small thickness, the insulating film 380 may be etched and removed during the fabricating process, or the semiconductor core, particularly the active layer 330, may be damaged. In order to prevent or reduce the possibility of damage of the active layer 330, the insulating film 380 of the light-emitting element 300 according to some example embodiments may have a thickness greater than or equal to a predetermined level (e.g., a set level). In some example embodiments, a thickness of the insulating film 380 may range from 10 nm to 1.0 μm, but the present disclosure is not limited thereto. In some embodiments, the thickness of the insulating film 380 may be about 40 nm.

The light-emitting element 300 may have a length ranging from 1 μm to 10 μm or from 2 μm to 6 μm, and in some embodiments from 3 μm to 5 μm. In some embodiments, a diameter of the light-emitting element 300 may range from 300 nm to 700 nm, and an aspect ratio of the light-emitting element 300 may range from 1.2 to 100. However, the present disclosure is not limited thereto, and the plurality of light-emitting elements 300 included in the display device 10 may have different diameters according to a composition difference of the active layer 330. In some embodiments, the diameter of the light-emitting element 300 may have a range of about 600 nm.

In the display device 10 according to some example embodiments, each pixel PX may include the emission area EMA in which the light-emitting elements 300 are disposed and non-emission area NEA in which the circuit elements, for example, the driving transistor DT and the switching transistor ST, are disposed. The driving transistor DT is disposed above the light-emitting element 300 so as not to overlap each other so that the light emitted from the light-emitting element 300 may travel in an upward or downward direction with respect to the substrate 110. Accordingly, the display device 10 may have a top emission structure or a bottom emission structure depending on the direction of the light emitted from the light-emitting element 300.

In some embodiments, in the display device 10, the contact electrodes 361 and 362 and the first active material layer 126 of the driving transistor DT are disposed on the first insulating layer 510. For example, the first active material layer 126 of the driving transistor DT may be disposed on the same layer as the contact electrodes 361 and 362. In some example embodiments, the contact electrodes 361 and 362 may include the same material as the first active material layer 126, and the contact electrodes 361 and 362 and the first active material layer 126 may be generated in the same process during the fabricating process of the display device 10. Accordingly, the number of fabricating processes of the display device 10 may be reduced. This will be described in detail below with reference to other example embodiments.

Hereinafter, the process of fabricating the display device 10 will be described with reference to other drawings.

FIGS. 6-13 are cross-sectional views illustrating the process of fabricating the display device according to some example embodiments of the present disclosure.

Figure 6:
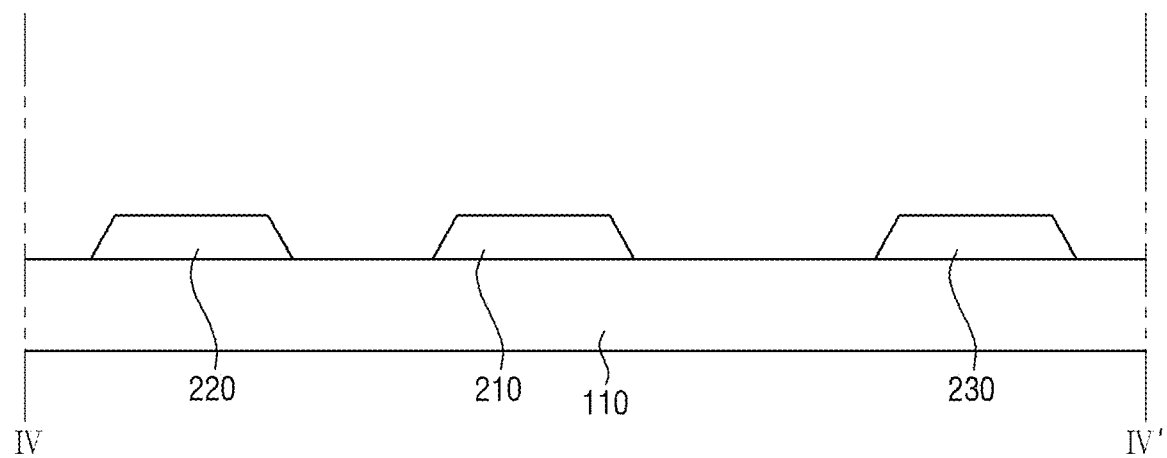
FIGS. 6-13 are cross-sectional views illustrating a process of fabricating the display device, according to some example embodiments of the present disclosure.
Figure 7:
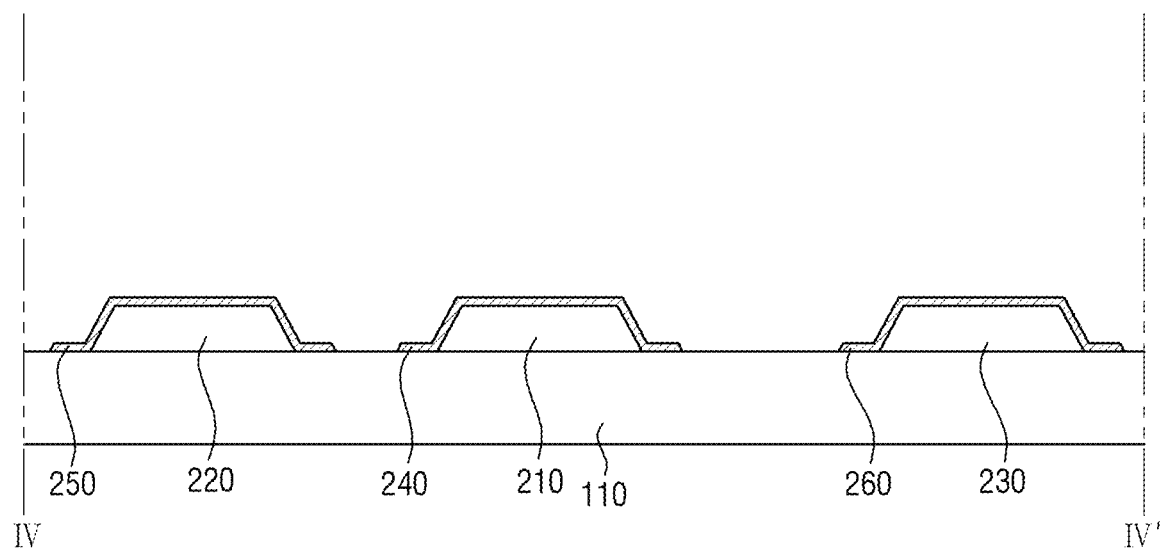

Referring to FIGS. 6 and 7, first, a substrate 110 is prepared, and a plurality of banks 210, 220, and 230 disposed on the substrate 110, and a first electrode 240, a second electrode 250, and a light-shielding layer 260, which are disposed on the plurality of banks 210, 220, and 230, are formed. The banks may include a first bank 210, a second bank 220, and a third bank 230. The arrangement of the first electrode 240, the second electrode 250, and the light-shielding layer 260 is the same as described above, and thus a detailed description thereof will be omitted, as one of the ordinary skill in the art would be able to appreciate from the detailed description of FIG. 4. The above-described members may be formed by patterning a metal, an inorganic material, an organic material, or the like by performing a typical mask process.

In some embodiments, in the drawings, the banks 210, 220, and 230, the electrodes 240 and 250, and the light-shielding layer 260 are illustrated as being formed on the substrate 110 in a separate process, but the present disclosure is not limited thereto. In some example embodiments, the banks 210, 220, and 230 may be omitted, and the electrodes 240 and 250 and the light-shielding layer 260 may include a plurality of layers such that at least portion thereof have a protruding shape.

Figure 8:
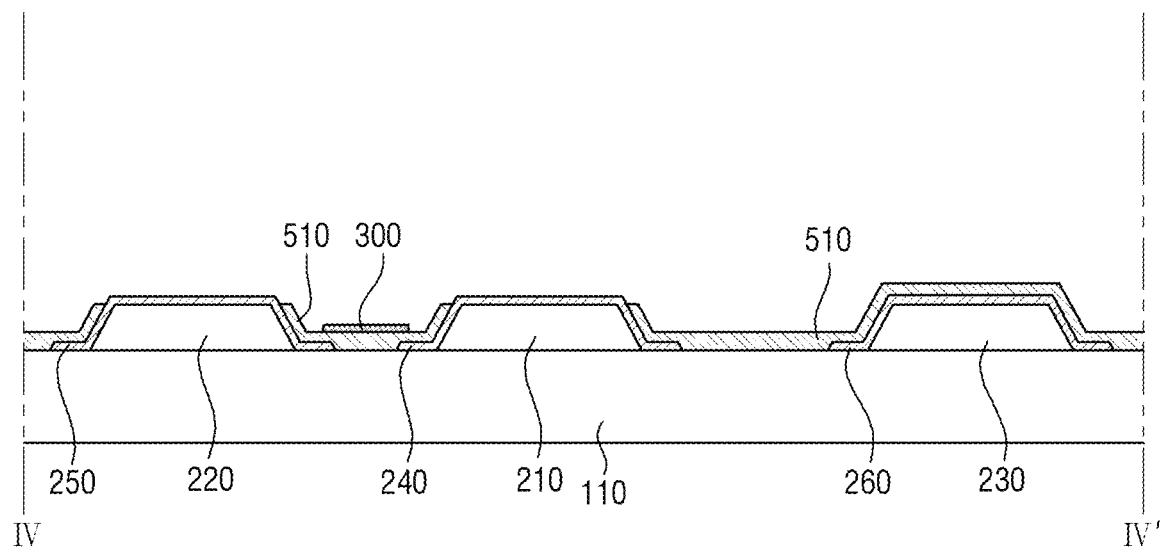

Subsequently, referring to FIG. 8, a first insulating layer 510 is formed on the electrodes 240 and 250 and the light-shielding layer 260, and light-emitting elements 300 are aligned between the first electrode 240 and the second electrode 250. The first insulating layer 510 may be formed through a process of forming the first insulating layer 510 above the substrate 110 to cover top surfaces of the first electrode 240 and the second electrode 250 and then etching at least portion of the first insulating layer 510 after the light-emitting elements 300 are aligned. The process of forming the first insulating layer 510 may be performed through a patterning process using a mask known to a person skilled in the art.

The light-emitting elements 300 may be aligned between the electrodes 240 and 250 by spraying an ink including the light-emitting element 300 on the first electrode 240 and the second electrode 250 and applying an electrical signal to the first electrode 240 and the second electrode 250. When the electrical signal is applied to the first electrode 240 and the second electrode 250 to which the ink is sprayed, an electric field is generated in the ink, and the positions and orientations of the light-emitting elements 300 are changed by the electric field so that the light-emitting elements 300 may be mounted between the electrodes 240 and 250. Here, the light-emitting elements 300 may be aligned such that the extending directions thereof become constant according to the direction of the electric field. Subsequently, the solvent of the ink may be removed to dispose the light-emitting elements 300 between the electrodes 240 and 250.

Figure 9:
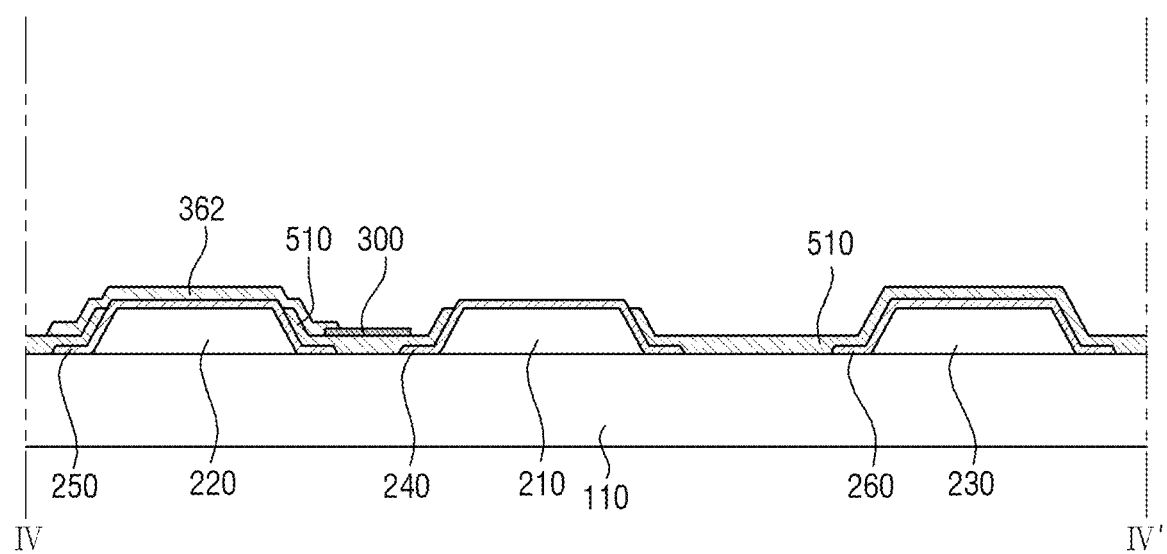
Figure 10:
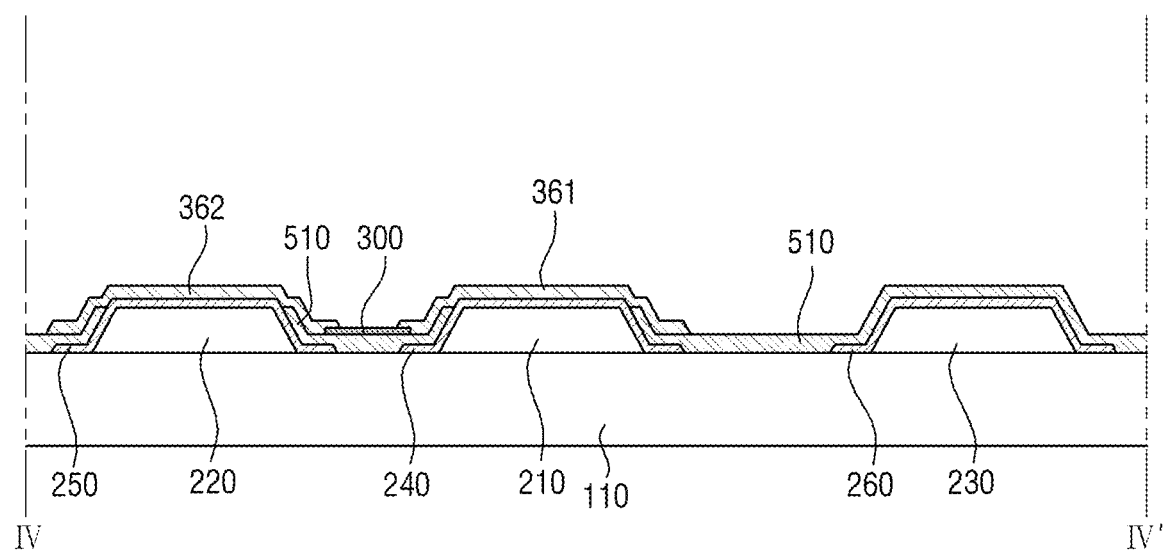

Next, referring to FIGS. 9 and 10, contact electrodes 361 and 362 are formed on the first electrode 240 and the second electrode 250. In the drawings, it is illustrated that a second contact electrode 362 is formed first, and then a first contact electrode 361 is formed, but the present disclosure is not limited thereto. The first and second contact electrodes 361 and 362 may be formed in the same process, or the first contact electrode 361 may be formed first.

Figure 11:
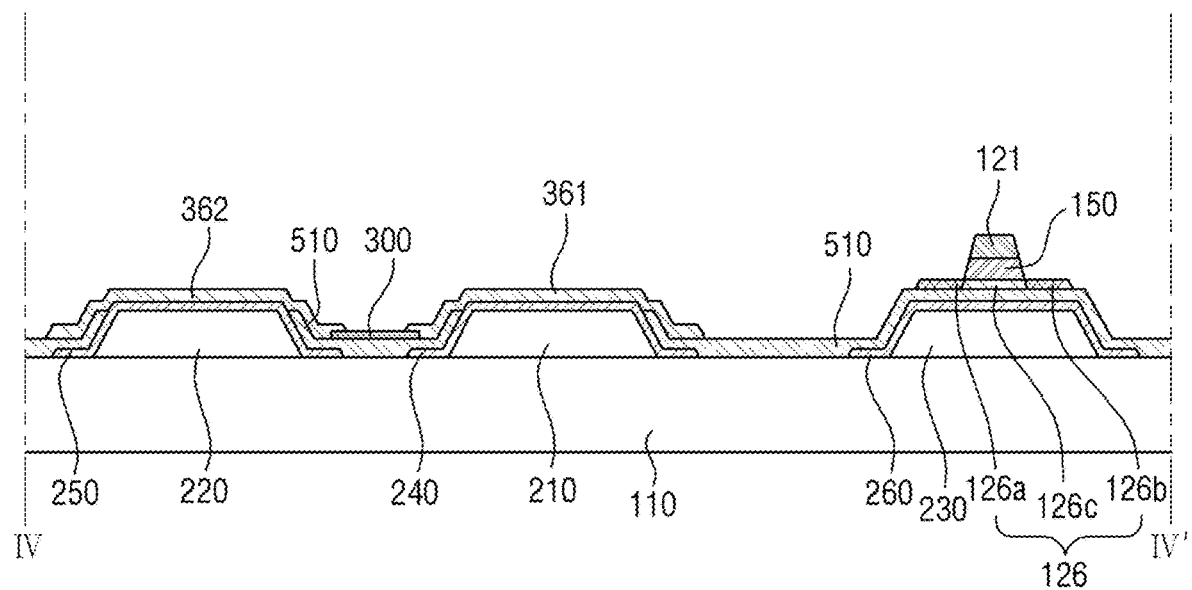

Subsequently, referring to FIG. 11, a first active material layer 126 is formed on the first insulating layer 510 that overlaps the light-shielding layer 260, and a gate insulating layer 150 and a gate electrode 121 are formed on an upper portion of the first active material layer 126.

The first contact electrode 361 and the second contact electrode 362 may be disposed on the same layer as the first active material layer 126 of a driving transistor DT as described above. When the contact electrodes 361 and 362 and the first active material layer 126 are made of different materials, the contact electrodes 361 and 362 and the first active material layer 126 may be formed in different processes as illustrated in the drawings. However, when the contact electrodes 361 and 362 and the first active material layer 126 include the same material, for example, an oxide semiconductor, the contact electrodes 361 and 362 and the first active material layer 126 may be formed in the same process. For example, in the process of forming a conductive area and a channel area in the first active material layer 126, the contact electrodes 361 and 362 having the oxide semiconductor may also be concurrently (e.g., simultaneously) conductive. In some embodiments, the process of forming the contact electrodes 361 and 362 and the first active material layer 126 may be performed in one process, and the number of fabricating processes of the display device 10 may be reduced.

Figure 12:
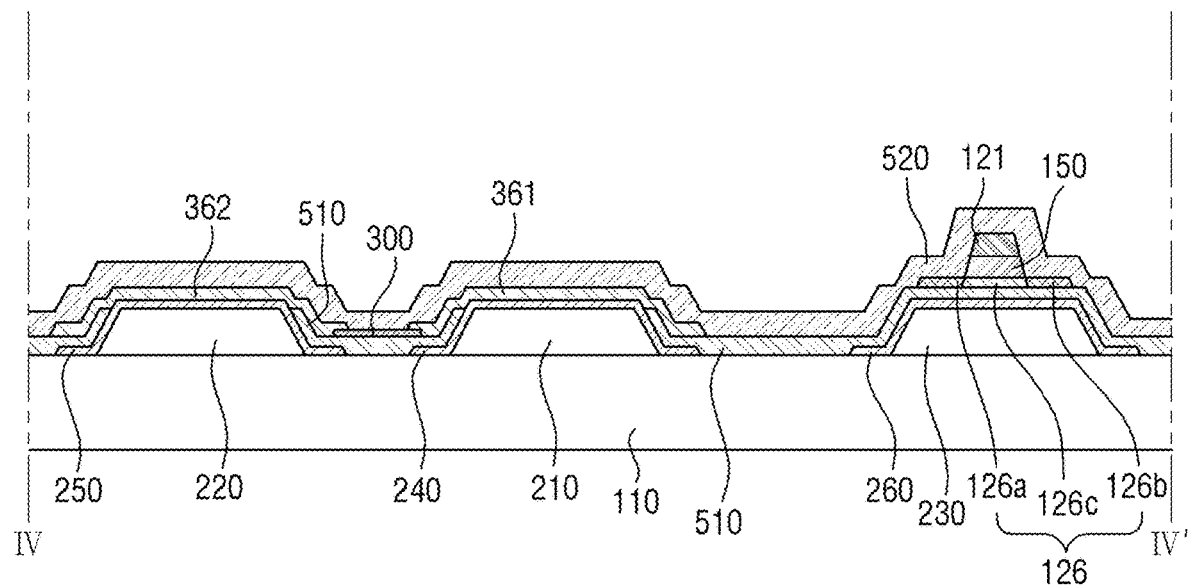
Figure 13:
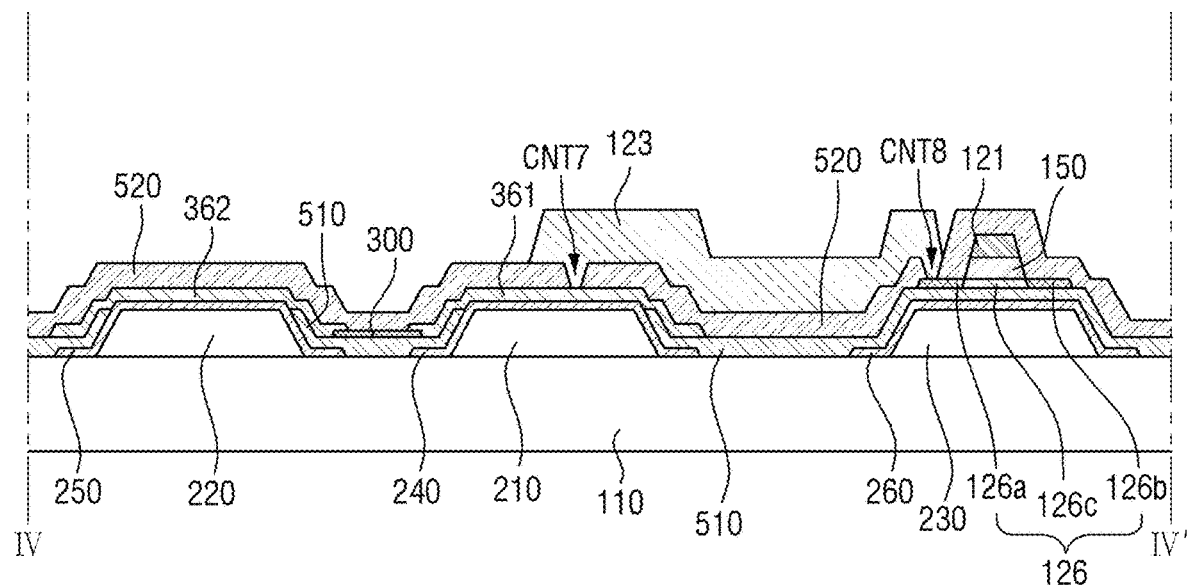
Figure 14:
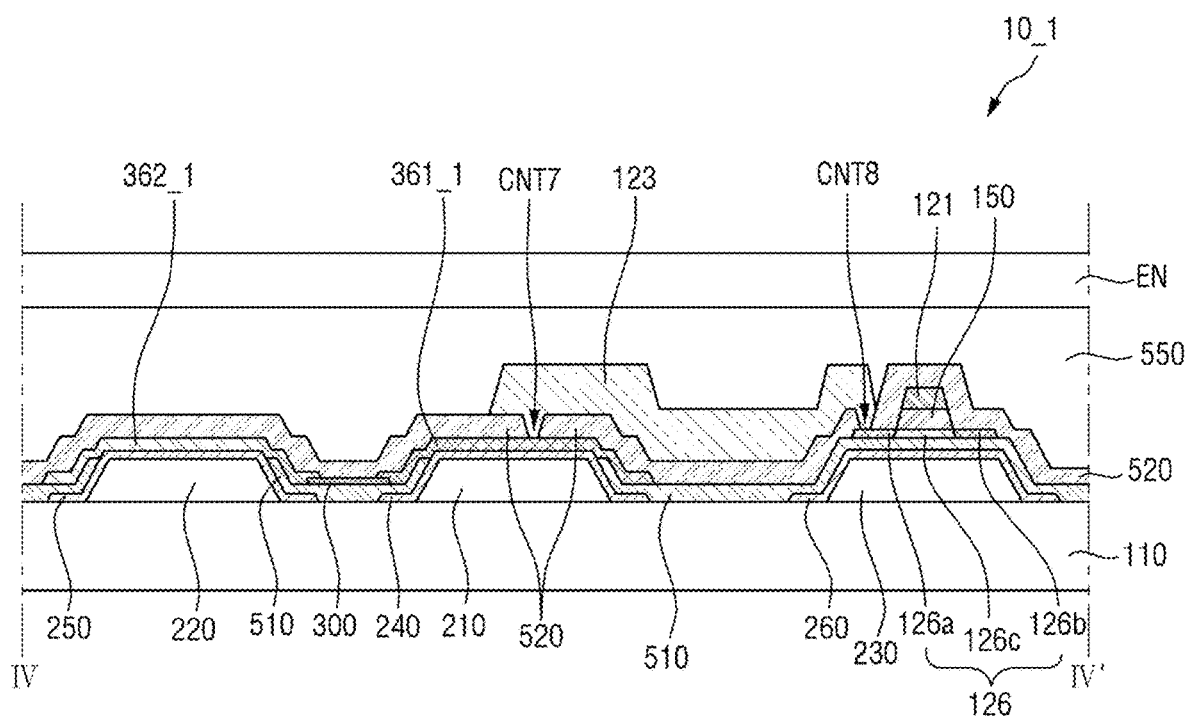
FIG. 14 is a partial cross-sectional view of a display device, according to some example embodiments of the present disclosure.

Next, referring to FIGS. 12-14, a second insulating layer 520 and an one electrode 123 of the driving transistor DT are formed, and a passivation layer 550 and an encapsulation layer EN, which are disposed above the second insulating layer 520 and the one electrode 123, are formed, thereby fabricating the display device 10.

In the display device 10 according to some example embodiments, the driving transistor DT, which is disposed in a non-emission area NEA, is disposed above the light-emitting element 300 that is disposed in an emission area EMA. Accordingly, the contact electrodes 361 and 362 in contact with the light-emitting element 300 may be disposed on the same layer as the first active material layer 126 of the driving transistor DT, and the number of fabricating processes may be reduced in the process of forming the contact electrodes 361 and 362 and the first active material layer 126.

Hereinafter, various example embodiments of the display device 10 will be described.

FIG. 14 is a partial cross-sectional view of a display device according to some example embodiments of the present disclosure.

Referring to FIG. 14, in a display device 10_1 according to some example embodiments, at least one of contact electrodes 361_1 and 362_1 may include an oxide semiconductor and may include the same material as a first active material layer 126 of a driving transistor DT. In some embodiments, the contact electrodes 361_1 and 362_1 including the oxide semiconductor may be formed in the same process as the first active material layer 126 and thus may become conductive together with a first conductive area 126a. For example, the contact electrodes 361_1 and 362_1 may include the same material as the first conductive area 126a of the first active material layer 126. The present example embodiment differs from the example embodiment described with reference to FIG. 4 in that the contact electrodes 361_1 and 362_1 include the same material as the first active material layer 126. Hereinafter, repeated descriptions will be omitted and a description will be made to focus on a difference, as one of the ordinary skill in the art would be able to appreciate from the detailed description of the previous drawings.

In the display device 10_1 of FIG. 14, a first contact electrode 361_1 includes an oxide semiconductor, and thus the first contact electrode 361_1 may include the same material as the first conductive area 126a of the first active material layer 126. The contact electrodes 361_1 and 362_1 and the first active material layer 126 are disposed on the first insulating layer 510 and thus may be disposed on substantially the same layer. During a fabricating process of the display device 10_1, a contact electrode including the same material as the first active material layer 126 from among the contact electrodes 361_1 and 362_1 may be formed concurrently (e.g., simultaneously) with the first active material layer 126. For example, when the first contact electrode 361_1 includes the same material as the first active material layer 126, the first contact electrode 361_1 and the first active material layer 126 may be concurrently (e.g., simultaneously) formed before or after the process of forming a second contact electrode 362_1 is performed. Accordingly, one operation may be omitted in the process of forming the contact electrodes 361_1 and 362_1, and the number of fabricating processes of the display device 10_1 may be reduced.

Figure 15:
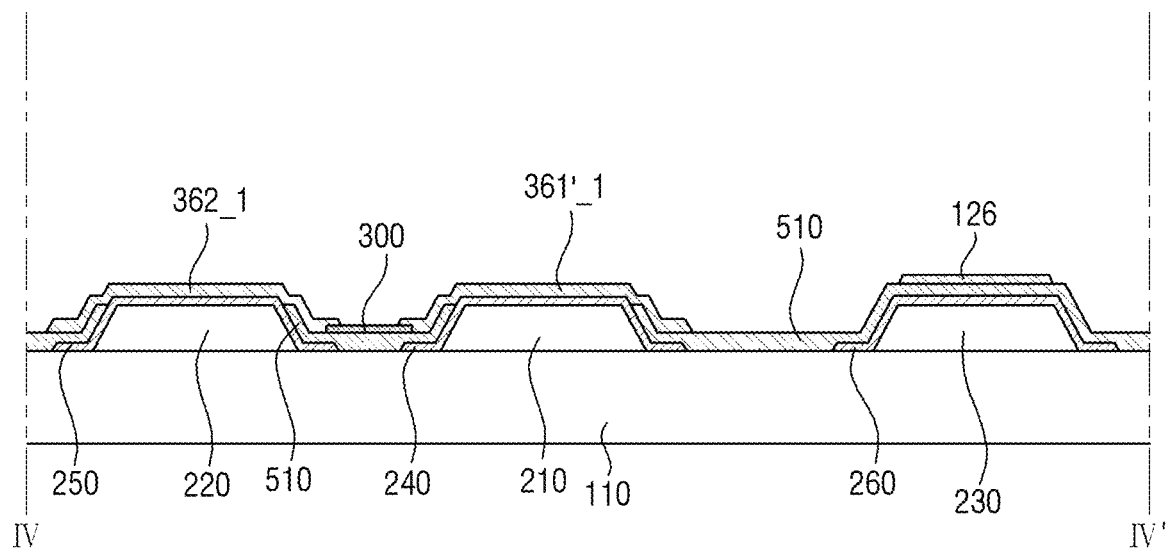
FIGS. 15 and 16 are cross-sectional views illustrating a process of fabricating the display device of FIG. 14, according to some example embodiments of the present disclosure.
Figure 16:
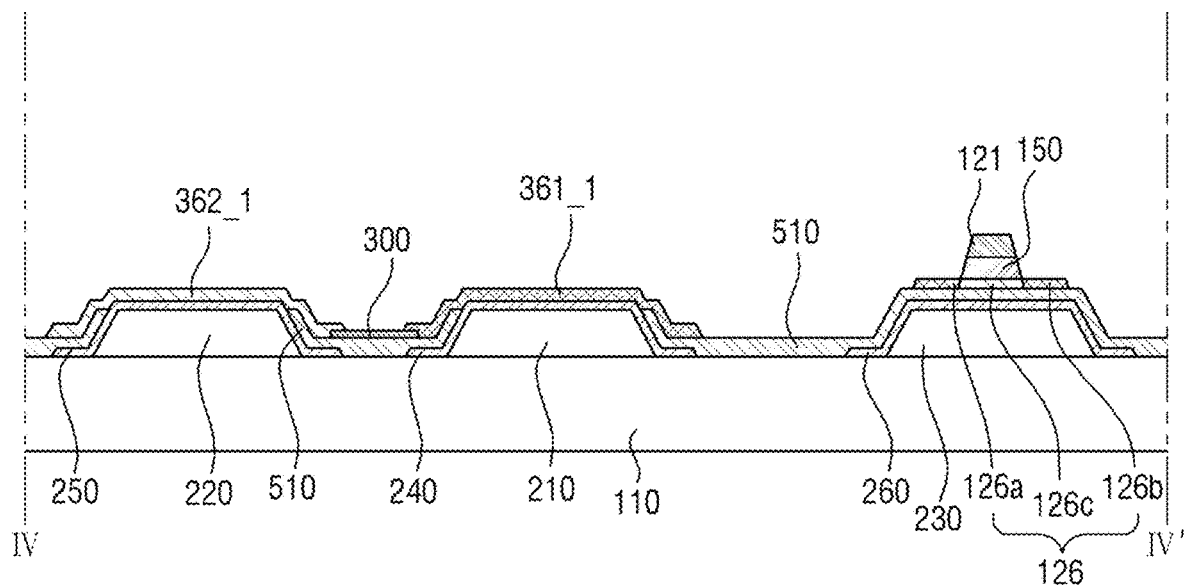

FIGS. 15 and 16 are cross-sectional views illustrating a process of fabricating the display device of FIG. 14, according to some embodiments of the present disclosure.

First, referring to FIG. 15, a first insulating layer 510 is formed on each of electrodes 240 and 250 and a light-shielding layer 260, and then an oxide semiconductor forming a second contact electrode 362_1 and a first contact electrode 361'_1 and a first active material layer 126 is formed. Subsequently, referring to FIG. 16, a portion of the oxide semiconductor becomes conductive to form the first contact electrode 361_1 disposed on the first electrode 240 and conductive areas 126a and 126b of the first active material layer 126. In some example embodiments, the number of fabricating processes in the operation of forming the first contact electrode 361_1, the second contact electrode 362_1, and the first active material layer 126 may be reduced as compared with the operation illustrated in FIGS.

9-11. The number of fabricating processes may be reduced by forming the second contact electrode 362_1 including other materials first, and then forming the first contact electrode 361_1 and the first active material layer 126 in the same process.

In some embodiments, in the second contact electrode 362, when the oxide semiconductor is included in the same manner as the first contact electrode 361, the number of fabricating processes may be further reduced.

Figure 17:
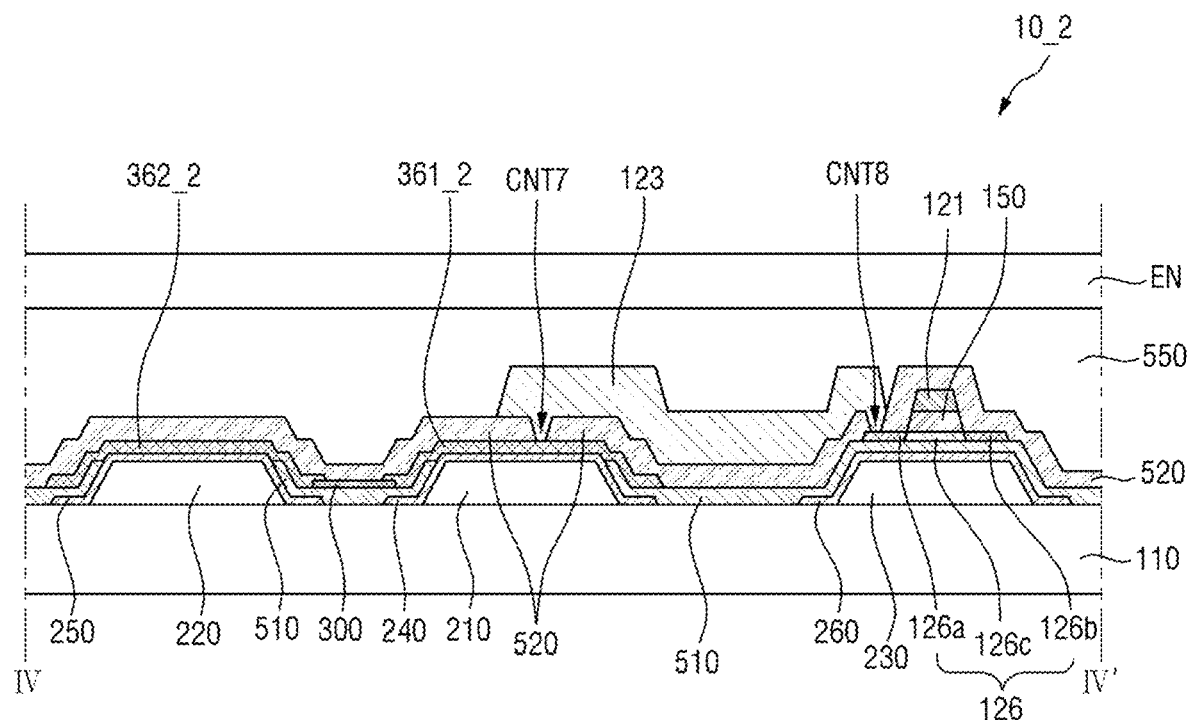
FIG. 17 is a partial cross-sectional view of a display device, according to some example embodiments of the present disclosure.
Figure 18:
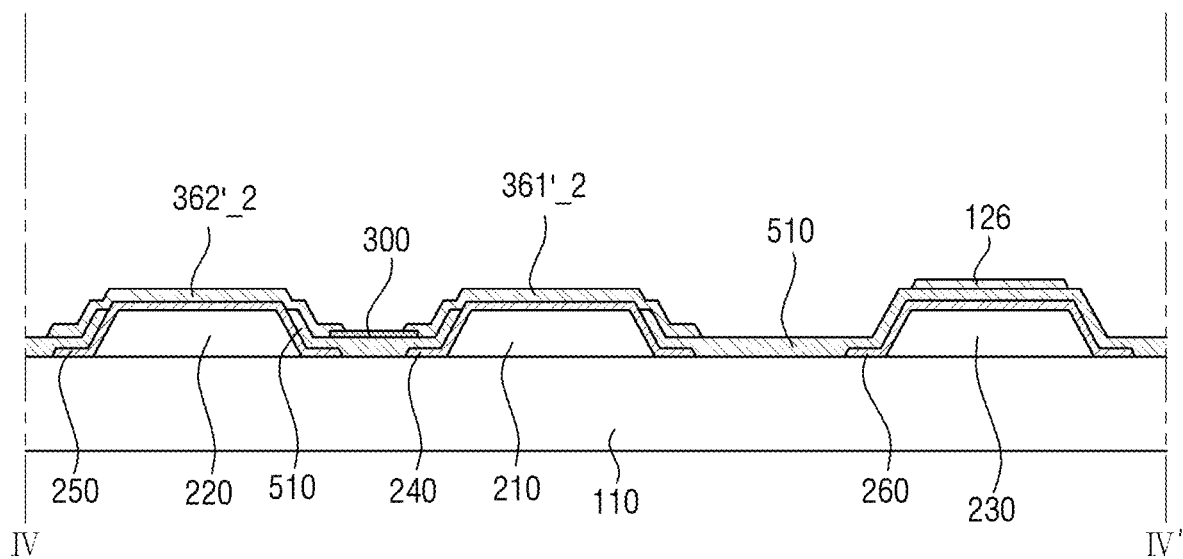
FIGS. 18 and 19 are cross-sectional views illustrating a process of fabricating the display device of FIG. 17, according to some example embodiments of the present disclosure.
Figure 19:
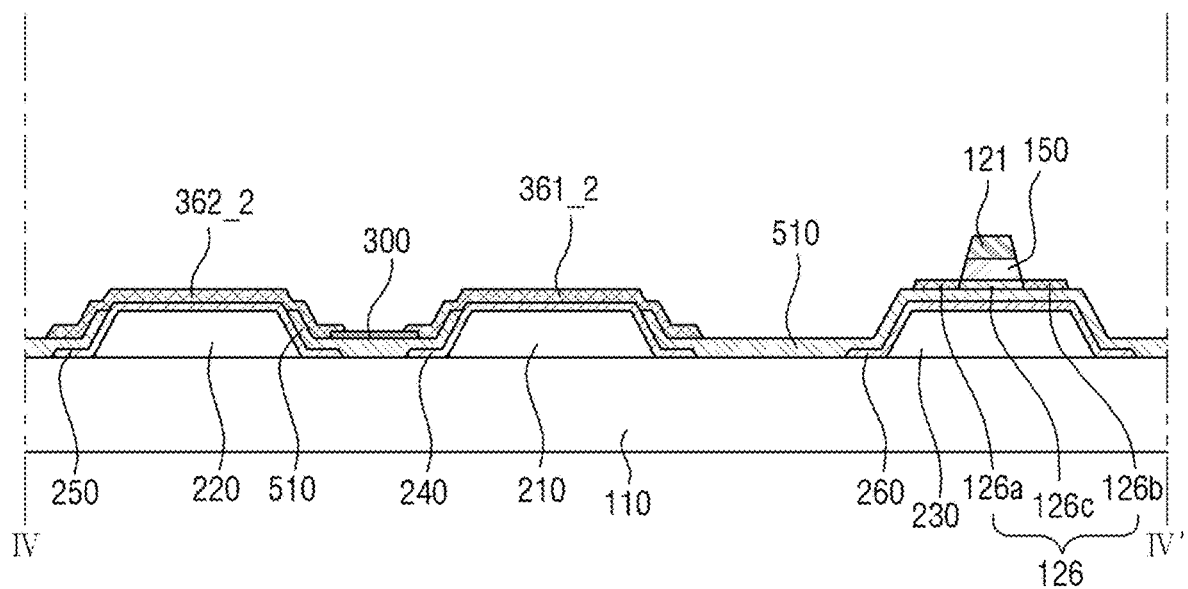

FIG. 17 is a partial cross-sectional view of a display device according to some example embodiments of the present disclosure. FIGS. 18 and 19 are cross-sectional views illustrating a process of fabricating the display device of FIG. 17.

Referring to FIG. 17, in a display device 10_2 according to some example embodiments, a first contact electrode 361_2 and a second contact electrode 362_2 may each include an oxide semiconductor and may include the same material as a first active material layer 126 of a driving transistor DT. The example embodiment of FIG. 17 differs from the example embodiment described with reference to FIG. 14 in that the second contact electrode 362_2 also includes the same material as the conductive areas 126a and 126b of the first active material layer 126.

Referring to FIGS. 18 and 19, a first insulating layer 510 is formed on electrodes 240 and 250 and a light-shielding layer 260, and then the oxide semiconductor is formed on the electrodes 240 and 250 and the light-shielding layer 260. Subsequently, the oxide semiconductor becomes conductive to form conductive areas 126a and 126b of the first active material layer 126, the first contact electrode 361_2, and the second contact electrode 362_2. In the example embodiment of FIG. 17, the number of fabricating processes in the operation of forming the first contact electrode 361_2, the second contact electrode 362_2, and the first active material layer 126 may be reduced as compared with the operation illustrated in FIGS. 15 and 16. The first contact electrode 361_2, the second contact electrode 362_2, and the first active material layer 126 may all be formed in the same process by including the same material so that the number of fabricating processes of the display device 10_2 may be further reduced. Hereinafter, repeated descriptions will be omitted, as one of the ordinary skill in the art would be able to appreciate from the detailed description of the previous drawings.

Figure 20:
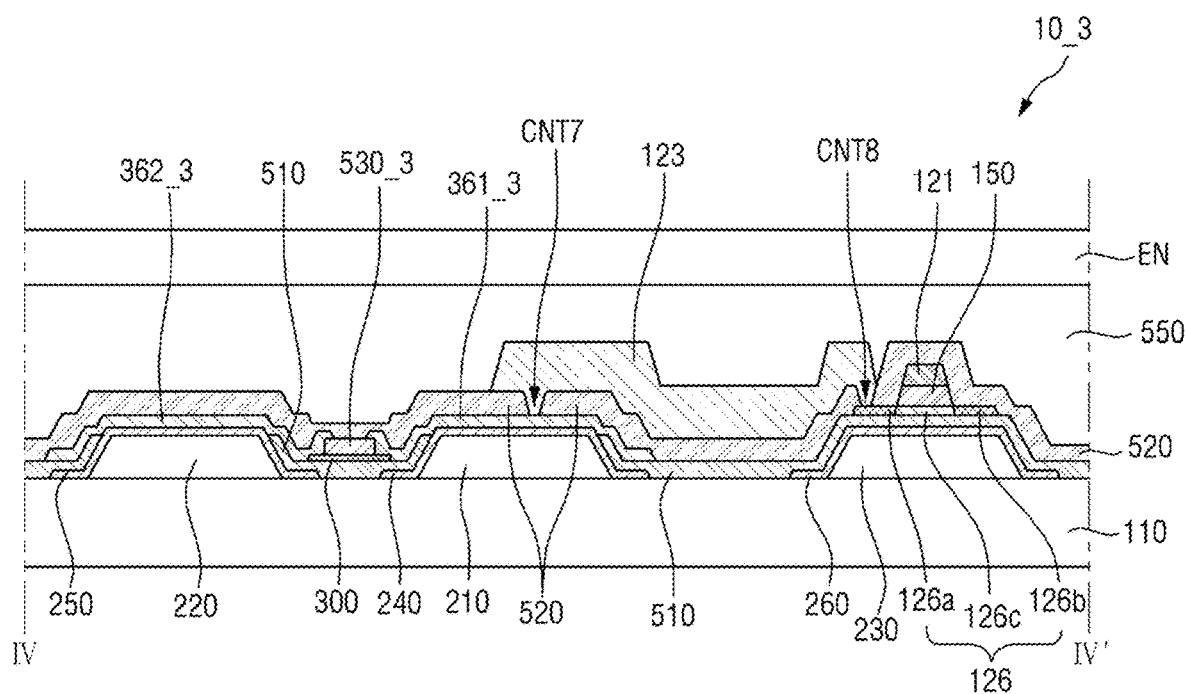
FIG. 20 is a partial cross-sectional view of a display device, according to some example embodiments of the present disclosure.

FIG. 20 is a partial cross-sectional view of a display device according to some example embodiments of the present disclosure.

Referring to FIG. 20, a display device 10_3 according to some example embodiments may further include a third insulating layer 530_3 disposed on a light-emitting element 300. The example embodiment of FIG. 20 differs from the example embodiment described with reference to FIG. 4 in that the display device 10_3 further includes the third insulating layer 530_3. Hereinafter, repeated descriptions will be omitted and a description will be made to focus on a difference.

The third insulating layer 530_3 may be partially disposed on the light-emitting element 300 disposed between a first electrode 240 and a second electrode 250. The third insulating layer 530_3 may be disposed to partially surround an outer surface of the light-emitting element 300 and thus may protect the light-emitting element 300 and may also serve to fix the light-emitting element 300 during the fabricating process of the display device 10_3. According to some example embodiments, the third insulating layer 530_3 may be disposed on the light-emitting element 300 and may expose one end portion and the other end portion of the light-emitting element 300. The exposed one end portion and the other end portion of the light-emitting element 300 may be in contact with contact electrodes 361_3 and 362_3 so that the light-emitting element 300 may receive an electrical signal from each of electrodes 240 and 250. The contact electrodes 361_3 and 362_3 according to the some example embodiments may be in contact with the third insulating layer 530_3. Such a shape of the third insulating layer 530_3 may be formed by a patterning process using a material forming the third insulating layer 530_3 by using a typical mask process. A mask to form the third insulating layer 530_3 has a width less than a length of the light-emitting element 300, and a material forming the third insulating layer 530_3 is patterned to expose both end portions of the light-emitting element 300. However, the present disclosure is not limited thereto.

Further, in some example embodiments, a portion of the material of the third insulating layer 530_3 may be disposed between a bottom surface of the light-emitting element 300 and a first insulating layer 510. The third insulating layer 530_3 may be formed to fill a space between the first insulating layer 510 and the light-emitting element 300, which is formed during the process of fabricating the display device 10_3. Accordingly, the third insulating layer 530_3 may be formed to partially surround the outer surface of the light-emitting element 300. However, the present disclosure is not limited thereto.

The third insulating layer 530_3 may be disposed to extend in the second direction DR2 between the first electrode 240 and the second electrode 250 in a plan view. As an example, in a plan view, the third insulating layer 530_3 may have an island shape or a linear shape on a substrate 110.

Figure 21:
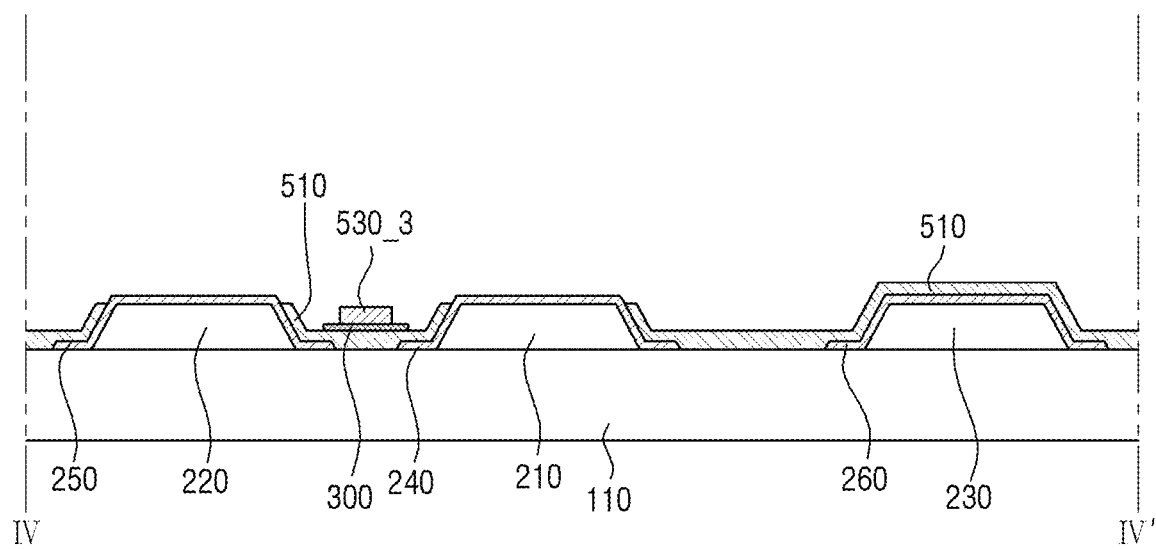
FIGS. 21 and 22 are cross-sectional views illustrating a process of fabricating the display device of FIG. 20, according to some example embodiments of the present disclosure.
Figure 22:
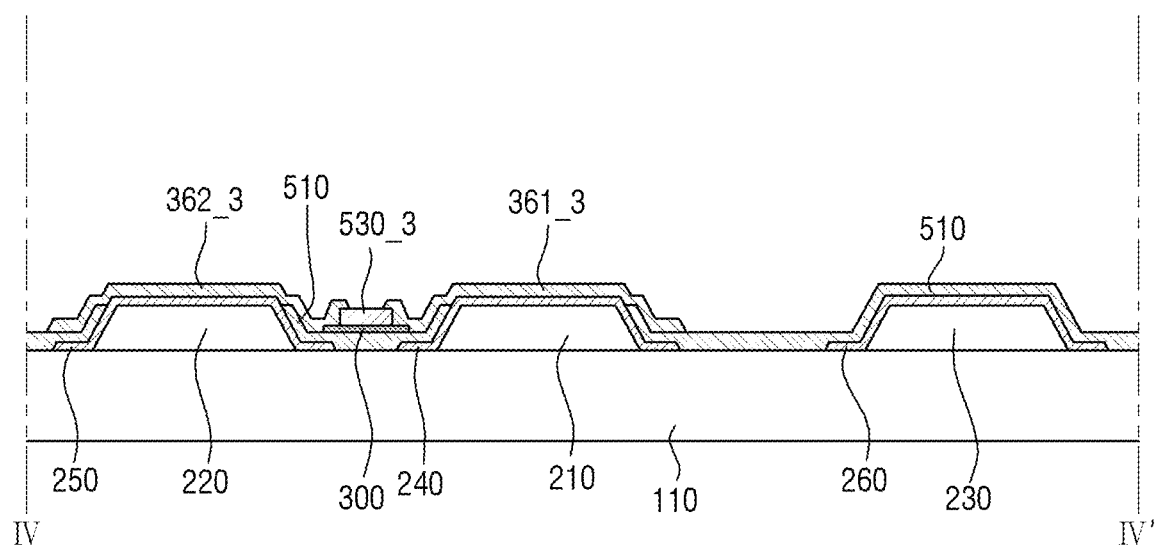

FIGS. 21 and 22 are cross-sectional views illustrating a process of fabricating the display device of FIG. 20, according to some embodiments of the present disclosure.

Referring to FIG. 21, a first insulating layer 510 is formed, and light-emitting elements 300 are aligned between a first electrode 240 and a second electrode 250, and then a third insulating layer 530_3 is formed on the light-emitting elements 300. Because the third insulating layer 530_3 is disposed to cover the light-emitting elements 300 aligned between the electrodes 240 and 250, the light-emitting elements 300 may be prevented (or protected) from being moved in a subsequent process. Such a shape of the third insulating layer 530_3 may be formed by forming a material constituting the third insulating layer 530_3 so as to cover all the members disposed on a substrate 110 and then partially patterning the material. The third insulating layer 530_3 may be formed before a first contact electrode 361_3 and a second contact electrode 362_3 are formed and thus may be disposed therebelow. For example, according to the example embodiment of FIG. 21, the third insulating layer 530_3 may be disposed between the contact electrodes 361_3 and 362_3 and the light-emitting element 300.

Subsequently, referring to FIG. 22, after forming the third insulating layer 530_3, the contact electrodes 361_3 and 362_3 disposed on the electrodes 240 and 250 are formed. A description thereof is the same as described above.

In some embodiments, banks 210, 220, and 230 disposed on the substrate 110 may each have inclined surfaces to reflect light emitted from the light-emitting element 300. However, in some example embodiments, when the electrodes 240 and 250 and a light-shielding layer 260 are each formed of a plurality of metal layers, another metal layer disposed on one metal layer may have inclined surfaces, and the banks 210, 220, and 230 may be omitted.

Figure 23:
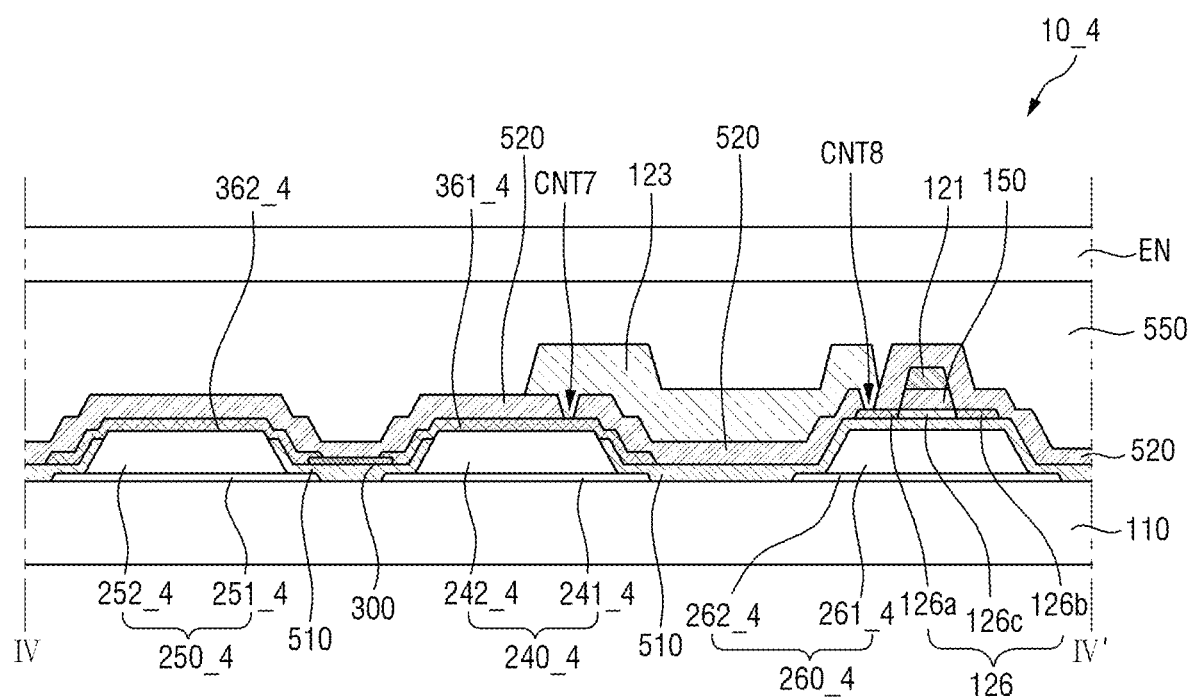
FIG. 23 is a partial cross-sectional view of a display device, according to some example embodiments of the present disclosure.

FIG. 23 is a partial cross-sectional view of a display device according to some example embodiments of the present disclosure.

Referring to FIG. 23, in a display device 10_4 according to some example embodiments, banks 210, 220, and 230 are omitted, and a first electrode 240_4, a second electrode 250_4, and a light-shielding layer 260_4 may include a plurality of metal layers. The metal layers may include first metal layers 241_4, 251_4, and 261_4 and second metal layers 242_4, 252_4, and 262_4 disposed on the first metal layers 241_4, 251_4, and 261_4. A first-1 metal layer 241_4 and a second-1 metal layer 242_4 may form one first electrode 240_4, a first-2 metal layer 251_4 and a second-2 metal layer 252_4 may form one second electrode 250_4, and a first-3 metal layer 261_4 and a second-3 metal layer 262_4 may form one light-shielding layer 260_4. Because descriptions of the first-1 metal layer 241_4 and the second-1 metal layer 242_4 of the first electrode 240_4 may be similarly applied to the second electrode 250_4 and the light-shielding layer 260_4, only the embodiment of the first electrode 240_4 will be described as an example below.

The first-1 metal layer 241_4 is disposed directly on a substrate 110, and the second-1 metal layer 242_4 is disposed on the first-1 metal layer 241_4. According to some example embodiments, a width of the first-1 metal layer 241_4 may be greater than a width of the second-1 metal layer 242_4, and a thickness of the second-1 metal layer 242_4 may be greater than a thickness of the first-1 metal layer 241_4. The second-1 metal layer 242_4 may have a shape protruding upward with respect to a top surface of the first-1 metal layer 241_4 and may include sloped surfaces (e.g., side surfaces) to reflect light emitted from light-emitting elements 300 in an upward direction like the banks 210, 220, and 230.

During a process of fabricating the display device 10_4, the light-emitting elements 300 may be aligned by applying an alignment signal through the first metal layers 241_4, 251_4, and 261_4, and while driving the display device 10_4, a driving signal may be transmitted through the second metal layers 242_4, 252_4, and 262_4. For example, in the second electrode 250_4, the conductive line 4600 (see FIG. 3) may be in contact with the second-2 metal layer 252_4 of the second electrode 250_4, and a second power voltage VSS may be transmitted through the second-2 metal layer 252_4, so that the second power voltage VSS may be transmitted to the second electrode 250_4 through the conductive line 4600. Likewise, a first contact electrode 361_4 and a second contact electrode 362_4 may be in contact with the second-1 metal layer 242_4 and the second-2 metal layer 252_4, respectively, so that an electrical signal may be transmitted to the light-emitting element 300.

The shapes of the first metal layer and the second metal layer may be formed through an etch-back process of disposing a material forming the first metal layer and the second metal layer on the entire surface of the substrate 110 and then concurrently (e.g., simultaneously) etching the first metal layer and the second metal layer. The first metal layer and the second metal layer include materials having different etch selectivity, and the second metal layer is first etched to form inclined surfaces, and then the first metal layer is etched to form the electrodes 240_4 and 250_4 and the light-shielding layer 260_4. Detailed descriptions thereof will be omitted, as one of the ordinary skill in the art would be able to appreciate from the detailed description of the previous drawings.

In some embodiments, the display device 10_4 may further include various members disposed to overlap the light-emitting element 300.

FIGS. 24-27 are partial cross-sectional views of display devices according to some example embodiments of the present disclosure.

Figure 24:
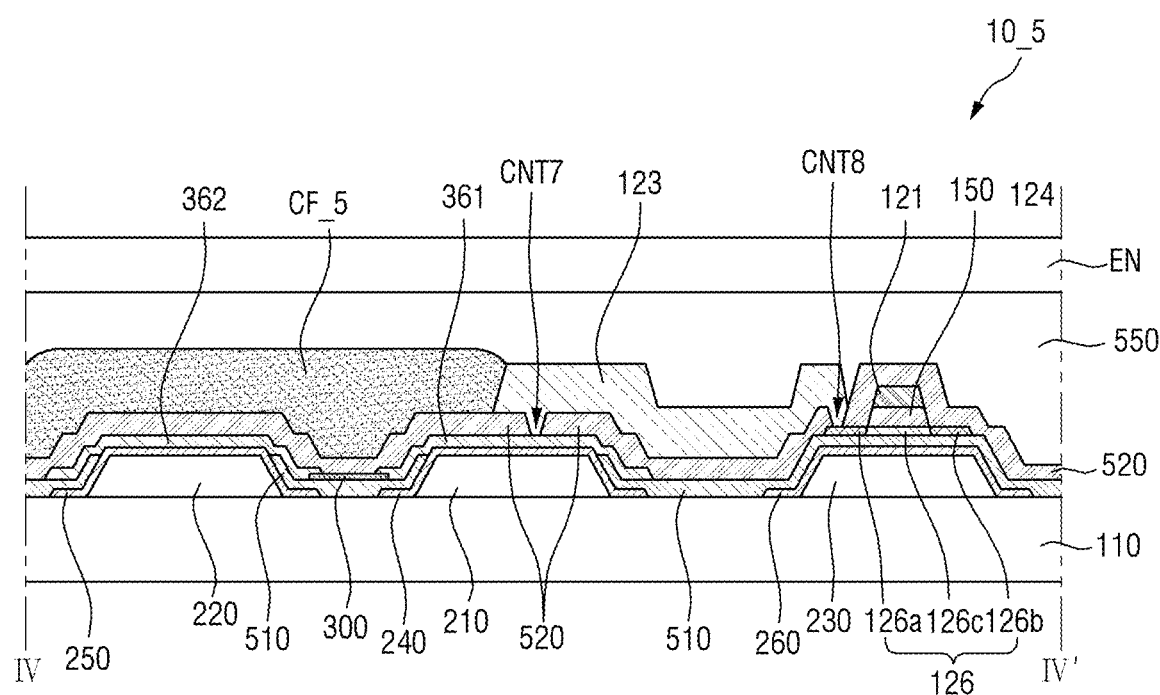
FIGS. 24-27 are partial cross-sectional views of display devices, according to some example embodiments of the present disclosure.

Referring to FIG. 24, a display device 10_5 according to some example embodiments may further include a color filter layer CF_5 disposed on a light-emitting element 300. The color filter layer CF_5 may be disposed on a second insulating layer 520 so that light emitted from the light-emitting element 300 is incident and may be disposed at a position overlapping the light-emitting element 300 in a thickness direction. The color filter layer CF_5 may selectively transmit light of any first color and may block light of colors other than the first color from being transmitted. In some example embodiments, the color filter layer CF_5 may include a colorant such as a dye or pigment of the first color. In the present disclosure, the term colorant may refer to a dye or a pigment or both of a dye and a pigment.

The colorant included in the color filter layer CF_5 may vary depending on the light emitted from the light-emitting element 300. For example, when the light-emitting element 300 emits red light, the color filter layer CF_5 may include a red colorant. Likewise, when the light-emitting element 300 emits green or blue light, the color filter layer CF_5 may include a green or blue colorant.

The light emitted from the light-emitting element 300 may be reflected from inclined surfaces of each of banks 210, 220, and 230, directed to upper portions of the banks 210, 220, and 230, and incident on the color filter layer CF_5. The color filter layer CF_5 may block light of different colors except for any first color from being transmitted, and each pixel PX may emit only light of any color according to the colorant of the color filter layer CF_5. The color filter layer CF_5 may improve the color purity of the light emitted from the light-emitting element 300.

In some embodiments, the display device 10_5 includes an emission area EMA and a non-emission area NEA, and the light-emitting element 300 and circuit elements are disposed in different areas. Accordingly, in the display device 10_5, the light emitted from the light-emitting element 300 may also be emitted in a downward direction rather than an upward direction with respect to a substrate 110.

Figure 25:
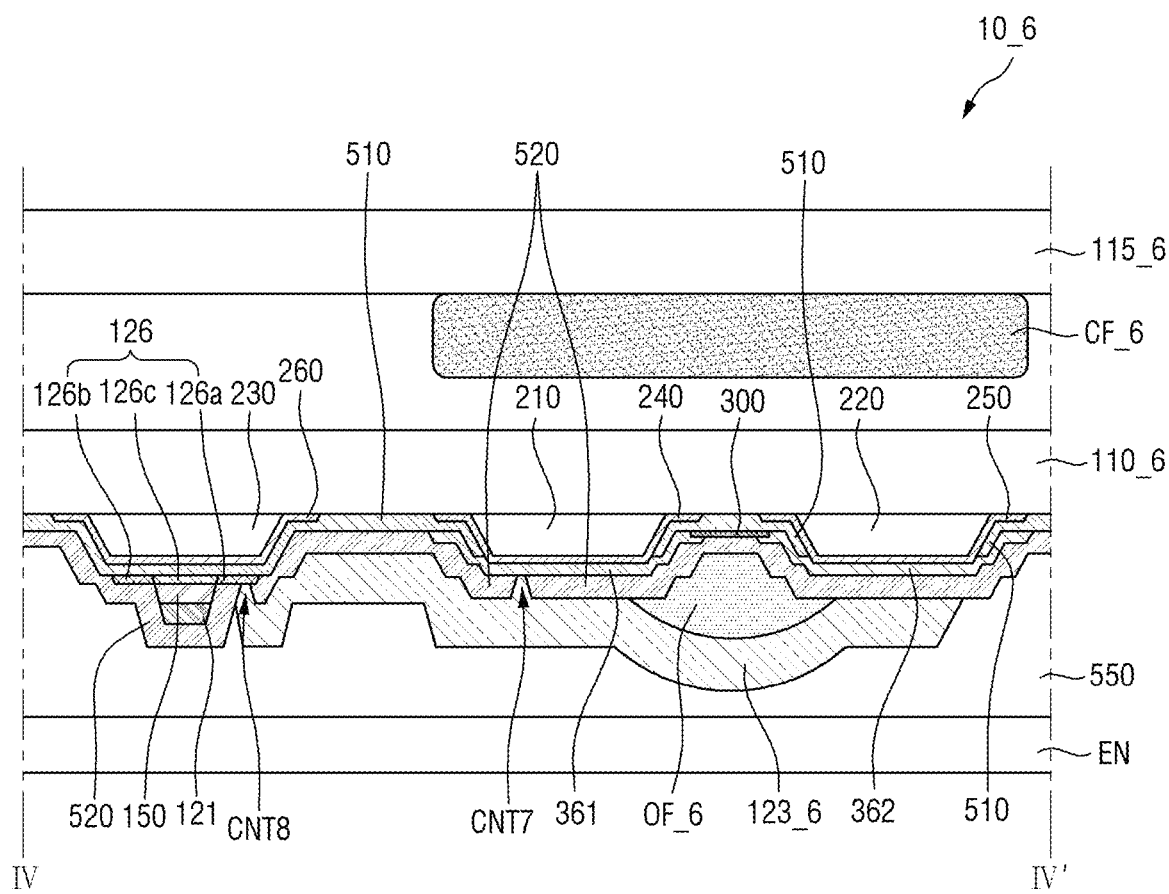

Referring to FIG. 25, a display device 10_6 according to some example embodiments includes a transparent organic film OF_6 disposed on a second insulating layer 520 and overlapping a light-emitting element 300 in a thickness direction, and an one electrode 123_6 of a driving transistor DT may be disposed to cover the transparent organic film OF_6. The one electrode 123_6 may include a material having a high reflectance to reflect light emitted from the light-emitting element 300 and transmitted through the transparent organic film OF_6 toward a substrate 110_6. Accordingly, the display device 10_6 may have a bottom emission structure in which light is emitted toward a bottom surface of the substrate 110_6 on which the light-emitting element 300 is disposed.

In some embodiments, the display device 10_6 may further include an opposite substrate 115_6 spaced from and opposite to the substrate 110_6, and a color filter layer CF_6 may be disposed on one surface of the opposite substrate 115_6. The light emitted from the light-emitting element 300 may be reflected by the one electrode 123_6 through the transparent organic film OF_6 and travel to the bottom surface of the substrate 110_6 to be incident on the color filter layer CF_6. Only a portion of the light incident on the color filter layer CF_6 may be transmitted, and another portion of the light incident on the color filter layer CF_6 may be blocked from being transmitted and may be emitted to the other surface of the opposite substrate 115_6.

Further, in some example embodiments, the transparent organic film OF_6 may be omitted, and a color filter layer CF may be disposed between the light-emitting element 300 and the one electrode 123.

Figure 26:
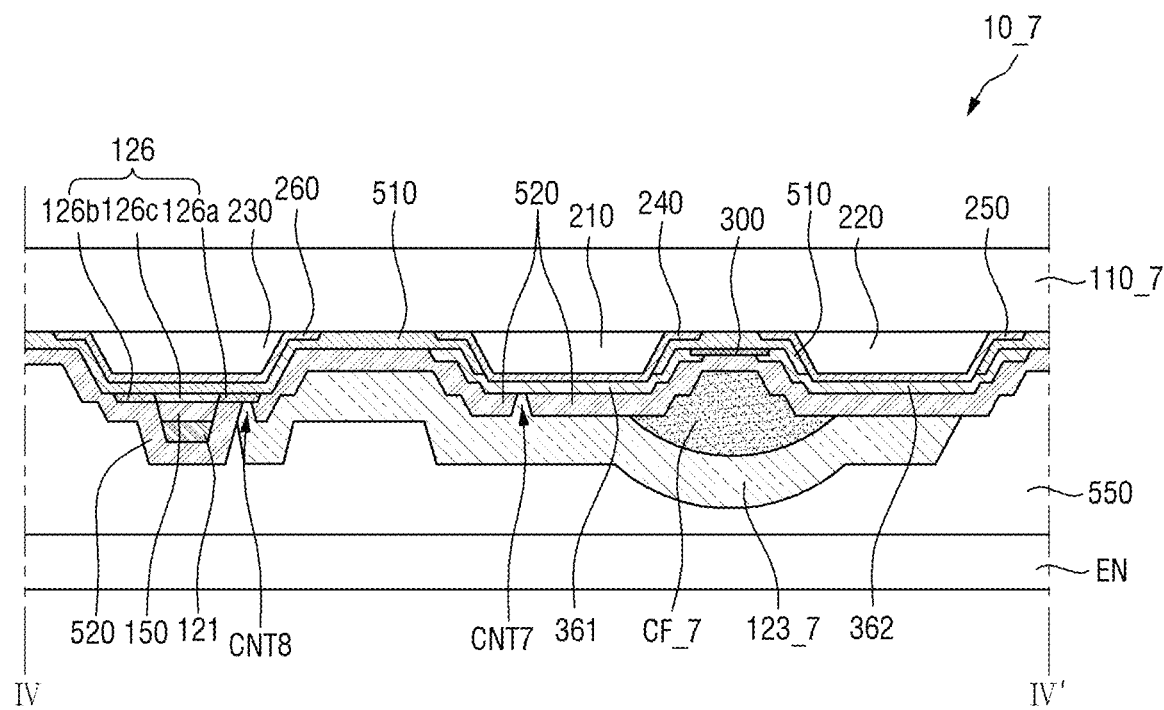

Referring to FIG. 26, in a display device 10_7 according to some example embodiments, a color filter layer CF_7 may be disposed on a second insulating layer 520 to overlap a light-emitting element 300, and an one electrode 123_7 of a driving transistor DT may be disposed to cover the color filter layer CF_7. The example embodiment of FIG. 26 differs from the example embodiment described with reference to FIG. 25 in that the color filter layer CF_7 is disposed in an area in which the transparent organic film OF_6 is disposed and the opposite substrate 115_6 is omitted. Descriptions of other configurations, except for the above description, are the same as described above, and thus detailed descriptions of other configurations will be omitted.

The display device 10_7 may further include a reflective layer that reflects light so that the light emitted from the light-emitting element 300 is concentrated within a predetermined (or set) area.

Figure 27:
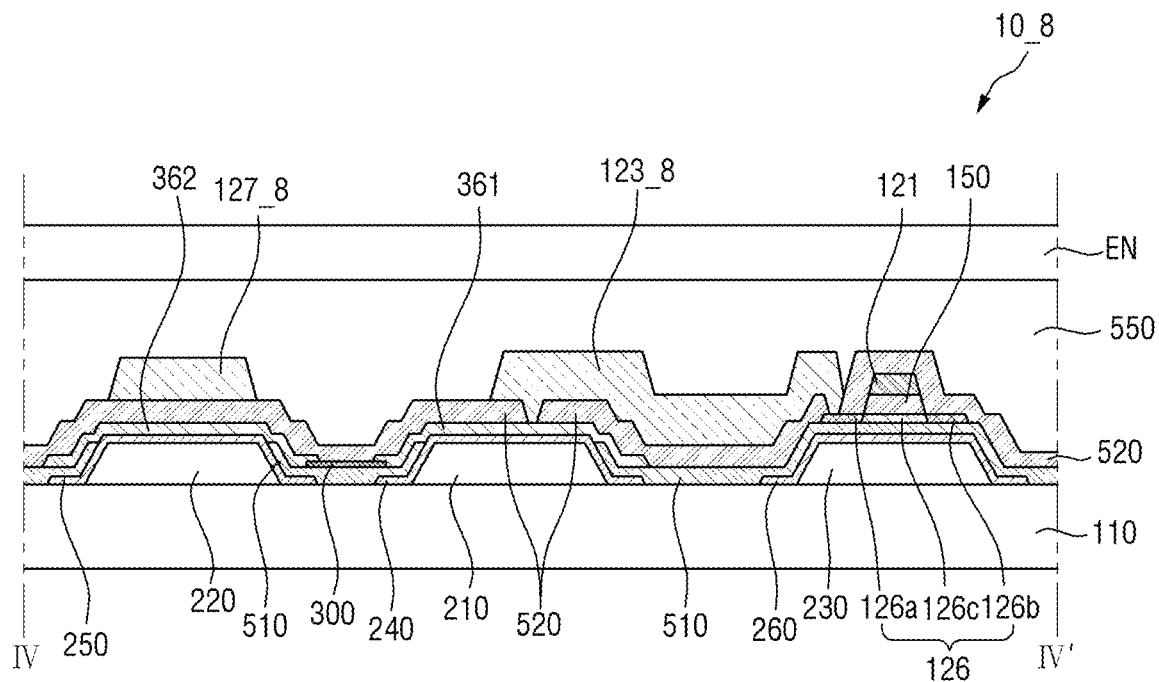

Referring to FIG. 27, a display device 10_8 according to some example embodiments may further include a reflective layer 127_8 disposed on a second insulating layer 520 to overlap a second electrode 250. The reflective layer 127_8 includes a material having a high reflectance and is disposed above the second electrode 250. Some of light emitted from a light-emitting element 300 may travel toward the reflective layer 127_8 and may be reflected by the reflective layer 127_8 to travel in an upward direction with respect to a substrate 110. The example embodiment of FIG. 27 differs from the example embodiment described with reference to FIG. 4 in that the reflective layer 127_8 is further included. Other repeated descriptions will be omitted, as one of the ordinary skill in the art would be able to appreciate from the detailed description of the previous drawings.

In a display device according to some example embodiments, each pixel includes an emission area in which light-emitting elements are disposed and a non-emission area in which circuit elements are disposed so that the display device can have a top emission structure or a bottom emission structure with respect to a substrate.

Further, an active material layer of a transistor among the circuit elements can be disposed above the light-emitting elements. Contact electrodes in contact with the light-emitting elements and electrodes can be disposed on the same layer as the active material layer of the transistor and can be formed in the same process together with the active material layer during the fabricating process of the display device. Accordingly, in the display device according to some example embodiments, the number of fabricating processes can be reduced.

In concluding the detailed description, those skilled in the art will appreciate that many variations and modifications can be made to the example embodiments without substantially departing from the principles of the present disclosure. Therefore, the example embodiments of the present disclosure are used in a generic and descriptive sense only and not for purposes of limitation.

What is claimed is:

1. A display device comprising:
   a substrate having an emission area and a non-emission area;
   a first electrode and a second electrode spaced from each other on the substrate in the emission area;
   a first insulating layer on the substrate in the emission area and the non-emission area and covering at least a portion of the first electrode and the second electrode;
   a light-emitting element between the first electrode and the second electrode;
   a first contact electrode on the first electrode and in contact with one end portion of the light-emitting element, and a second contact electrode on the second electrode and in contact with the other end portion of the light-emitting element; and
   a first active material layer on the first insulating layer in the non-emission area and electrically connected to the first contact electrode, a gate insulating layer on the first active material layer, a gate electrode on the gate insulating layer and overlapping the first active material layer, and an one electrode in contact with at least one side of the first active material layer,
   wherein at least a portion of the first contact electrode and at least a portion of the second contact electrode are on a same layer as the first active material layer.

2. The display device of claim 1, wherein the first active material layer, the first contact electrode, and the second contact electrode comprise an oxide semiconductor.

3. The display device of claim 2, wherein the first active material layer comprises a first conductive area, a second conductive area, and a channel area positioned between the first conductive area and the second conductive area, and
   wherein the first contact electrode and the second contact electrode comprise the same material as the first conductive area.

4. The display device of claim 3, wherein the light-emitting element does not overlap at least the first active material layer in a thickness direction.

5. The display device of claim 1, further comprising a second insulating layer on the first contact electrode, the second contact electrode, and the first active material layer in the emission area and the non-emission area.

6. The display device of claim 5, wherein at least a portion of the first contact electrode and the second contact electrode is on the first insulating layer.

7. The display device of claim 6, wherein the second insulating layer covers at least a portion of the first active material layer and the gate electrode.

8. The display device of claim 7, wherein the one electrode is on the second insulating layer and is in contact with the first contact electrode.

9. The display device of claim 5, further comprising a third insulating layer on the light-emitting element and exposing both end portions of the light-emitting element.

10. The display device of claim 9, wherein the first contact electrode and the second contact electrode are in contact with the third insulating layer.

11. The display device of claim 5, further comprising a color filter layer on the second insulating layer and overlapping the light-emitting element.

12. The display device of claim 5, further comprising a reflective layer on the second insulating layer and overlapping the second electrode.

13. The display device of claim 1, further comprising a light-shielding layer between the first insulating layer and the substrate, and below the first active material layer in the non-emission area.

14. The display device of claim 13, further comprising a first bank between the first electrode and the substrate, and a second bank between the second electrode and the substrate.

15. The display device of claim 13, wherein the first electrode, the second electrode, and the light-shielding layer comprise a first metal layer on the substrate and a second metal layer on the first metal layer.

16. The display device of claim 15, wherein the first metal layer has a width greater than a width of the second metal layer, and the second metal layer has a thickness greater than a thickness of the first metal layer.

17. A display device comprising:
- a substrate having an emission area and a non-emission area;
- a first electrode on the substrate in the emission area and extending in a first direction;
- a second electrode spaced from the first electrode in a second direction and extending in the first direction;
- a plurality of light-emitting elements between the first electrode and the second electrode;
- a first contact electrode extending in the first direction on the first electrode and in contact with one end portion of each of the light-emitting elements;
- a second contact electrode extending in the first direction on the second electrode and in contact with the other end portion of each of the light-emitting elements;
- a first voltage line located in the non-emission area and extending in the first direction;
- a first semiconductor area located in the non-emission area and extending in the second direction and partially overlapping the first voltage line; and
- an one electrode overlapping the first contact electrode and one side of the first semiconductor area.

18. The display device of claim 17, further comprising a light-shielding layer located in the non-emission area and extending in the first direction to partially overlap the first semiconductor area.

19. The display device of claim 18, wherein the first semiconductor area is in contact with the first voltage line through a first contact hole exposing the first voltage line in an area overlapping the first voltage line, and
wherein the one electrode is in contact with the first contact electrode and one side of the first semiconductor area.

20. The display device of claim 19, wherein a pad electrode is on the first voltage line exposed through the first contact hole, and
wherein the first semiconductor area is in contact with the pad electrode.

* * * * *